(12) United States Patent
Lu et al.

(10) Patent No.: US 12,197,680 B2
(45) Date of Patent: Jan. 14, 2025

(54) DISPLAY PANEL AND DISPLAY DEVICE

(71) Applicant: Shanghai Tianma Micro-electronics Co., Ltd., Shanghai (CN)

(72) Inventors: Feng Lu, Shanghai (CN); Yaodong Wu, Shanghai (CN); Yang Zeng, Shanghai (CN)

(73) Assignee: Shanghai Tianma Micro-electronics Co., Ltd., Shanghai (CN)

( * ) Notice: Subject to any disclaimer, the term of this patent is extended or adjusted under 35 U.S.C. 154(b) by 0 days.

(21) Appl. No.: 18/142,151

(22) Filed: May 2, 2023

(65) Prior Publication Data
US 2024/0302922 A1 Sep. 12, 2024

(30) Foreign Application Priority Data
Mar. 9, 2023 (CN) .......................... 202310226871.4

(51) Int. Cl.
*G06F 3/042* (2006.01)
*G06V 40/13* (2022.01)
*H10K 39/34* (2023.01)
*H10K 59/40* (2023.01)

(52) U.S. Cl.
CPC .......... *G06F 3/042* (2013.01); *G06V 40/1318* (2022.01); *H10K 39/34* (2023.02); *H10K 59/40* (2023.02); *G06F 2203/04102* (2013.01); *G06F 2203/04107* (2013.01)

(58) Field of Classification Search
CPC ........... G06F 3/042; G06F 2203/04102; G06F 2203/04107; G06V 40/1318; H10K 39/34; H10K 59/40
See application file for complete search history.

(56) References Cited

U.S. PATENT DOCUMENTS

2019/0013368 A1* 1/2019 Chung .................... H10K 59/40
2020/0411608 A1* 12/2020 Tang ...................... G06F 3/0446

* cited by examiner

*Primary Examiner* — Abhishek Sarma
(74) *Attorney, Agent, or Firm* — Anova Law Group, PLLC

(57) ABSTRACT

A display panel and a display device are provided. The display panel includes a substrate; light-emitting devices on a side of the substrate; photosensitive devices on the side of the substrate same as the light-emitting devices; and touch electrodes on a side of the photosensitive devices away from the substrate. The display panel includes a light-emitting region and a non-light-emitting region. The light-emitting devices correspond to the light-emitting region; and the photosensitive devices are disposed in the non-light-emitting region.

19 Claims, 15 Drawing Sheets

DISPLAY PANEL AND DISPLAY DEVICE

CROSS-REFERENCE TO RELATED APPLICATION

This application claims the priority of Chinese Patent Application No. 202310226871.4, filed on Mar. 9, 2023, the content of which is incorporated herein by reference in its entirety.

TECHNICAL FIELD

The present disclosure generally relates to the field of display technology and, more particularly, relates to a display panel and a display device.

BACKGROUND

As shown in FIG. 1, a structure type of a foldable screen includes, along a direction perpendicular to the thickness of the foldable screen, a display layer 01, a fingerprint recognition unit 02 bonded to a backlight side of the display layer 01, and a thickness matching component 03 provided in a layer same as the fingerprint identification unit 02. Further, the film layer structure of the foldable screen at least includes a cover plate 05, a metal frame 06, and a hinged back plate 07. The thickness of the film layer where the fingerprint recognition unit 02 and the thickness matching component 03 are located is about 100 μm, and this film layer structure leads to a relatively large thickness of the entire foldable screen module. Also, the fingerprint recognition unit 02 and the thickness matching component 03 are connected by dispensing glue 04. The film layer structure of the foldable screen is thicker, and the introduction of additional materials (the thickness matching component 03 and the dispensing glue 04) brings risks to the bending performance of the display module.

SUMMARY

One aspect of the present disclosure provides a display panel. The display panel includes a substrate; light-emitting devices on a side of the substrate; photosensitive devices on the side of the substrate same as the light-emitting devices; and touch electrodes on a side of the photosensitive devices away from the substrate. The display panel includes a light-emitting region and a non-light-emitting region. The light-emitting devices correspond to the light-emitting region; and the photosensitive devices are disposed in the non-light-emitting region.

Another aspect of the present disclosure provides a display device. The display device includes a display panel. The display panel includes a substrate; light-emitting devices on a side of the substrate; photosensitive devices on the side of the substrate same as the light-emitting devices; and touch electrodes on a side of the photosensitive devices away from the substrate. The display panel includes a light-emitting region and a non-light-emitting region. The light-emitting devices correspond to the light-emitting region; and the photosensitive devices are disposed in the non-light-emitting region.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
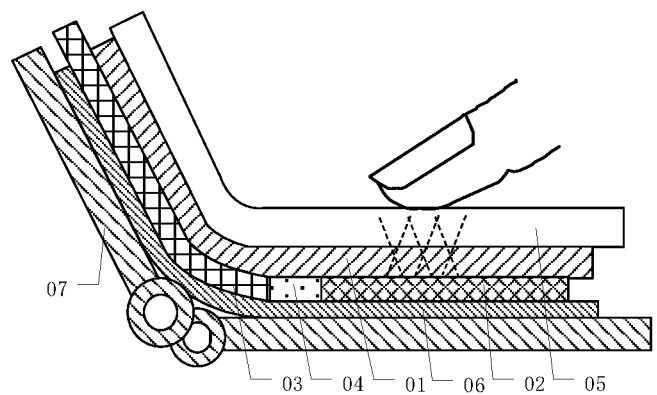
FIG. 1 illustrates a film layer structure of a display panel.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted.

Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure.

Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width, and depth should be considered during practical fabrication.

In the existing technologies, as shown in FIG. 1, a structure type of a foldable screen includes, along a direction perpendicular to the thickness of the foldable screen, a display layer 01, a fingerprint recognition unit 02 bonded to a backlight side of the display layer 01, and a thickness matching component 03 provided in a layer same as the fingerprint identification unit 02. Further, the film layer structure of the foldable screen at least includes a cover plate 05, a metal frame 06, and a hinged back plate 07. The thickness of the film layer where the fingerprint recognition unit 02 and the thickness matching component 03 are located is about 100 µm, and this film layer structure leads to a relatively large thickness of the entire foldable screen module. Also, the fingerprint recognition unit 02 and the thickness matching component 03 are connected by dispensing glue 04. The film layer structure of the foldable screen is thicker, and the introduction of additional materials (the thickness matching component 03 and the dispensing glue 04) brings risks to the bending performance of the display module. Therefore, it is imperative to provide a display panel to solve the bending performance problem of a foldable screen.

The present disclosure provides a display panel and a display device, to reduce a thickness of a display panel module and improve the bending performance of a foldable screen.

Figure 2:
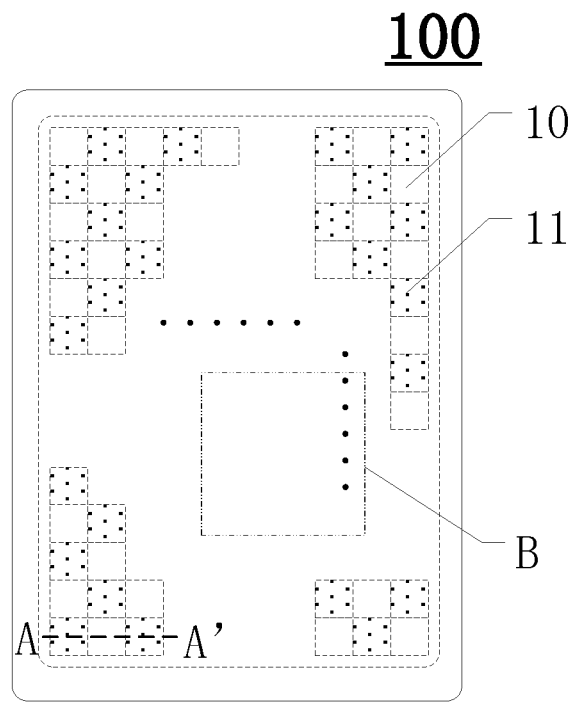
FIG. 2 illustrates an exemplary display panel consistent with various disclosed embodiments of the present disclosure.
Figure 3:
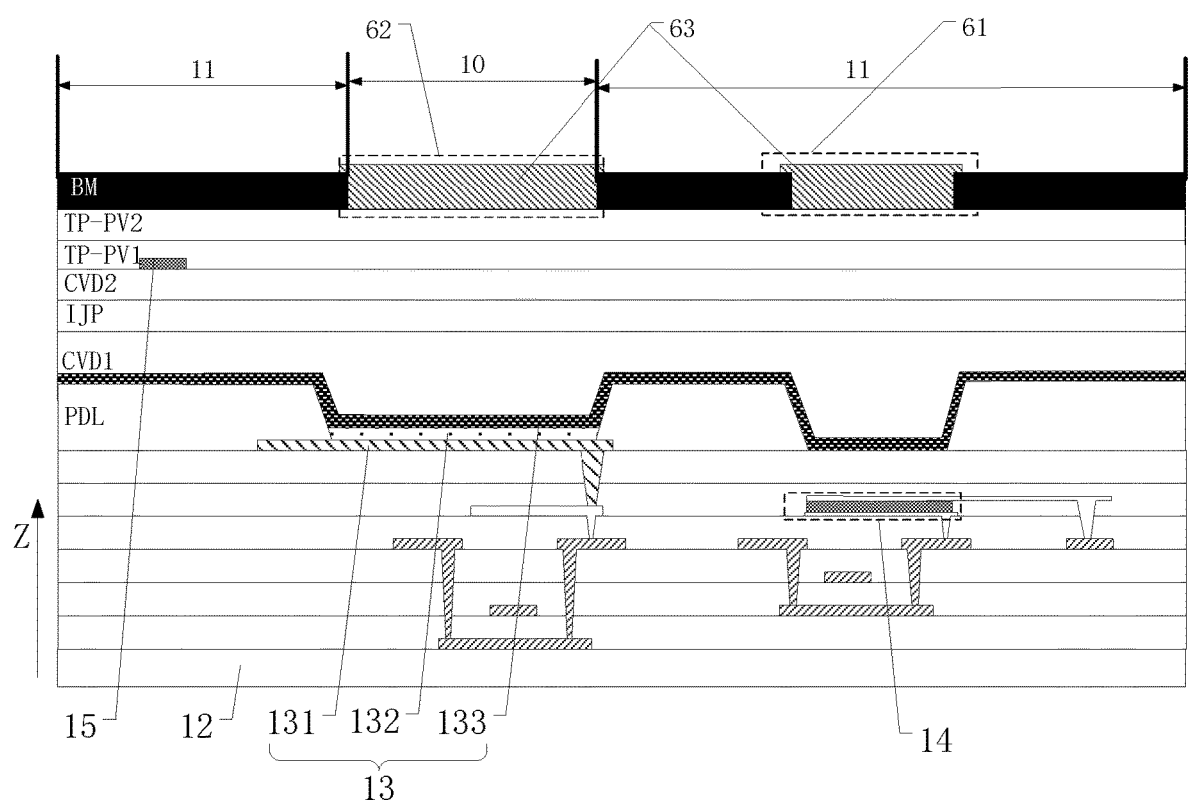
FIG. 3 illustrates a cross-sectional view of the display panel along an AA' direction in FIG. 2, consistent with various disclosed embodiments of the present disclosure.
Figure 4:
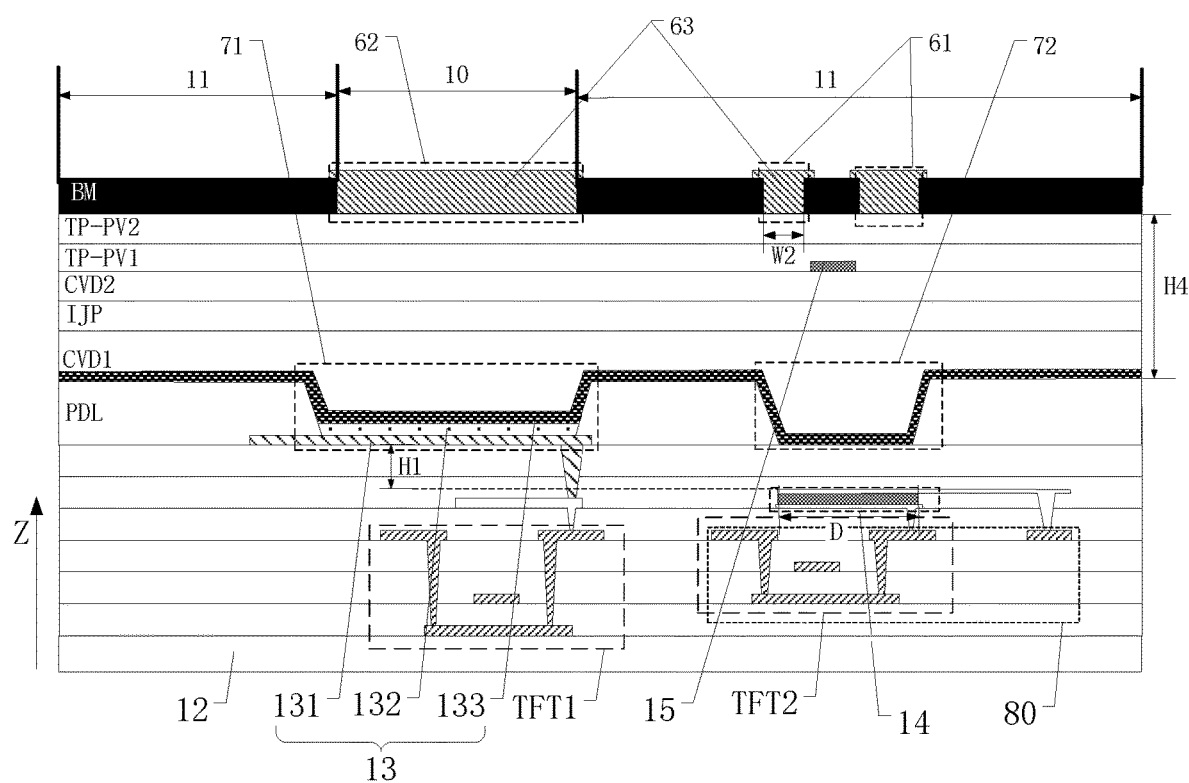
FIG. 4 illustrates another cross-sectional view of the display panel along an AA' direction in FIG. 2, consistent with various disclosed embodiments of the present disclosure.
Figure 5:
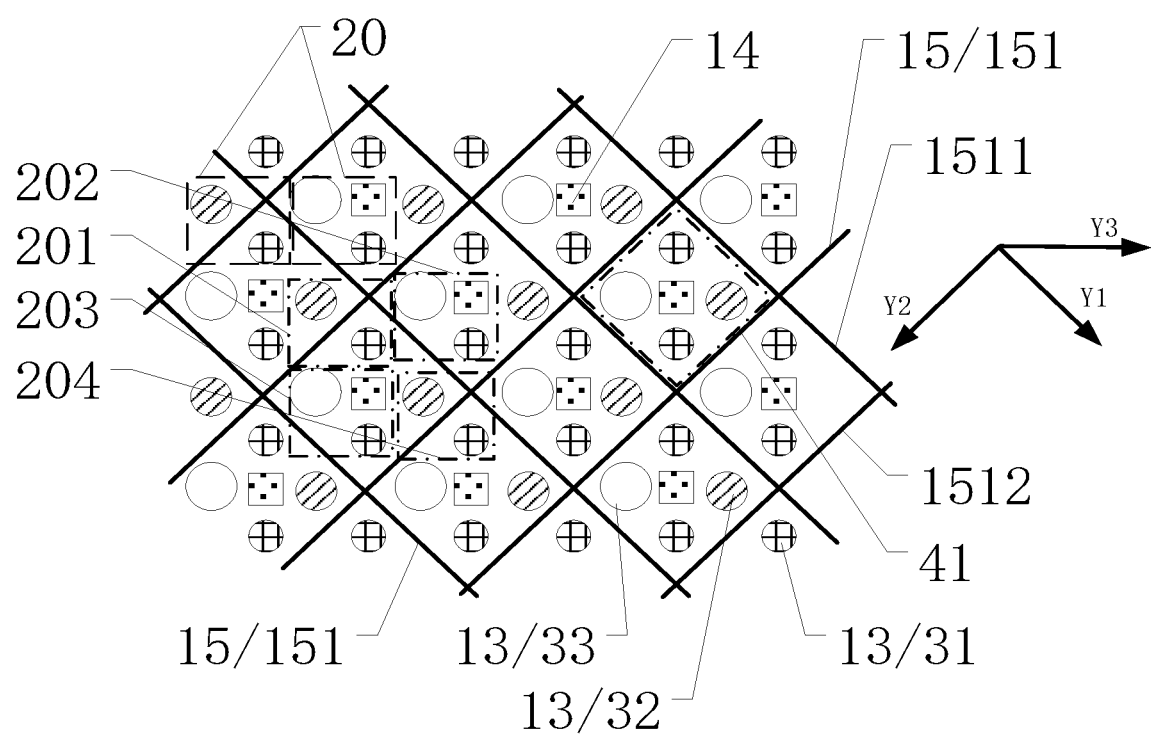
FIG. 5 illustrates an enlarged view of a B region of the display panel in FIG. 2, consistent with various disclosed embodiments of the present disclosure.
Figure 6:
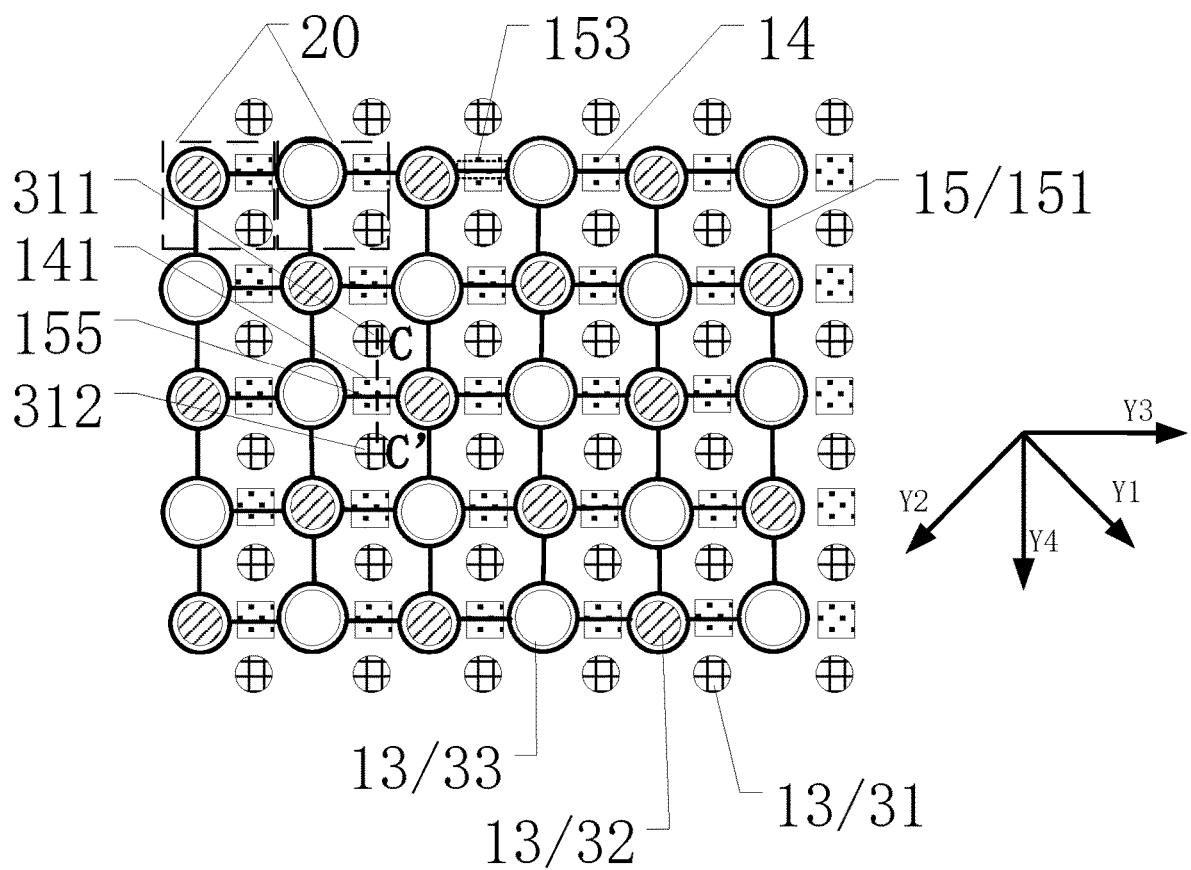
FIG. 6 illustrates another enlarged view of a B region of the display panel in FIG. 2, consistent with various disclosed embodiments of the present disclosure.

The present disclosure provides a display panel. FIG. 2 illustrates an exemplary display panel consistent with various disclosed embodiments of the present disclosure; FIG. 3 illustrates a cross-sectional view of the display panel along an AA' direction in FIG. 2, consistent with various disclosed embodiments of the present disclosure; FIG. 4 illustrates another cross-sectional view of the display panel along an AA' direction in FIG. 2, consistent with various disclosed embodiments of the present disclosure; FIG. 5 illustrates an enlarged view of a B region of the display panel in FIG. 2, consistent with various disclosed embodiments of the present disclosure; and FIG. 6 illustrates another enlarged view of a B region of the display panel in FIG. 2, consistent with various disclosed embodiments of the present disclosure. As shown in FIG. 2 to FIG. 6, in one embodiment, the display panel 100 may include a substrate 12; light-emitting devices 13 located on one side of the substrate 12, photosensitive devices 14 located on the same side of the substrate 12 as the light-emitting devices 13, and touch electrodes 15 on a side of the photosensitive devices 14 away from the substrate 12.

The display panel 100 may include a light-emitting region 10 and a non-light-emitting region 1. The light-emitting devices 13 may be correspondingly arranged in the light-emitting region 10, and the photosensitive devices 14 may be located in the non-light-emitting region 11.

In the present embodiment, the display panel 100 may include the substrate 12, and the light-emitting devices 13 and the photosensitive devices 14 located on the same side of the substrate 12. Further, the light-emitting devices 13 may be disposed in the light-emitting region 10, and the photosensitive devices 14 may be located in the non-light-emitting region 11. Therefore, the light-emitting devices 13 and the photosensitive devices 14 may be arranged in the same film layer structure. The light-emitting devices 13 may be used to realize the display function of the display panel 100, and the photosensitive devices 14 may be used to realize the fingerprint recognition function of the display panel 100. That is, the light-emitting devices 13 and the photosensitive devices 14 for realizing the display function and the fingerprint recognition function respectively may be integrated in a film substrate (rather than "in a same layer"), to avoid excessive increasing of the thickness of the film layers of the display panel 100 because of the simultaneous setting of the light-emitting devices 13 and the photosensitive devices 14 in the display panel 100, that is, to avoid excessive increasing of the thickness of the film layers of the display panel 100 because of that the light-emitting device 13 are disposed in one film substrate and the photosensitive devices 14 are disposed in another film substrate. Therefore, the thin design requirements of the display panel 100 may be satisfied. Also, the light-emitting devices 13 and the photosensitive devices 14 may be integrated in the same film substrate, to avoid a film layer for accommodating the light-emitting devices between the film layer where the photosensitive devices are located and a side of the light-emitting surface of the display panel. Correspondingly, the distance between the photosensitive devices 14 and a touch body on the side of the light-emitting surface of the display panel 100 may be smaller, the definition of the touch body sensed by the photosensitive devices 14 may be more accurate, and the fingerprint recognition accuracy may be improved when the photosensitive devices 14 are used for fingerprint recognition. Further, integrating of the light-emitting devices 13 and the photosensitive devices 14 in the same film substrate may also avoid the need to further set structures including a thickness matching part or dispensing glue in a same layer when the photosensitive devices are disposed on the separate film substrate in the existing technologies, to avoid the problems of poor bending performance of the display panel caused by the introduction of materials of the thickness matching part and dispensing glue. Risks such as breakage or poor contact when bending the corresponding display module may be avoided. Therefore, the bending performance of the corresponding display device including the display function and the fingerprint recognition function may be improved.

The embodiment where the photosensitive devices 14 are used as devices for the fingerprint recognition function of the display panel is used as an example of the usage of the photosensitive devices to illustrate the present disclosure only, and does not limit the scope of the present disclosure. In some other embodiments, the photosensitive devices 14 may be used for other functions including ranging or photosensitive imaging. The present disclosure has no limit on this, and the function of the photosensitive devices in the display panel may be configured according to the product design requirements.

Further, the display panel 100 may be provided with touch electrodes 15 to realize the touch sensing function of the display panel 100 in combination with the photosensitive devices 14. The touch electrodes 15 may be arranged on the side of the photosensitive devices 14 away from the substrate 12. In a direction Z perpendicular to the plane where the substrate 12 is located, orthographical projections of the touch electrodes 15 and orthographical projections of the photosensitive device 14 may at least partially overlap, or the orthographical projections of the touch electrodes 15 and the orthographical projections of the photosensitive device 14 may not overlap. In one embodiment shown in FIG. 3 and FIG. 5, the orthographical projections of the touch electrodes 15 and the orthographical projections of the photosensitive device 14 may have no overlapping areas. Therefore, the touch electrodes 15 may have no influence on the photosensitive regions of the photosensitive devices 14, to ensure the photosensitive effect of the photosensitive unit and enable the display panel 100 to have the display function and the touch sensing function. For example, in another embodiment shown in FIG. 4 and FIG. 6, the orthographical projections of the touch electrodes 15 and the orthographical projections of the photosensitive device 14 may have at least partially overlapping areas. The number or area of the photosensitive devices 14 in the display panel 100 may be increased, to improve the photosensitive effect of the display panel 100 and enable the display panel 100 to have the display function and the touch sensing function.

Further, the display panel 100 with the touch-control function provided by the present disclosure may have a simple structure and the fabrication process may be simpler.

In the present disclosure, the film layer relationship between the light-emitting devices 13 and the photosensitive devices 14 is not limited, that is, it is not limited that the light-emitting devices 13 and the photosensitive devices 14 need to be arranged on the same layer, as long as the light-emitting devices 13 and the photosensitive devices 14 are arranged in the same film layer substrate instead of two different film substrates. Since the light-emitting devices 13 are disposed in the light-emitting region 10 of the display panel 100 and the photosensitive devices 14 are disposed in the non-light-emitting region 11 of the display panel 100 in the present disclosure, the light-emitting devices 13 and the photosensitive devices 14 may be configured to be arranged on the same layer, or the light-emitting devices 13 may be configured to be located on the side of the photosensitive devices 14 away from the display panel 100, or the light-emitting devices 13 may be configured to be located on the side of the photosensitive devices 14 facing the display panel 100, according to the actual requirements, as long as the light-emitting devices 13 and the photosensitive devices 14 are be able to be arranged in the same film layer substrate, to avoid excessive increase in the thickness of the film layers of the display panel 100 and ensure that the display panel 100 has the good display function and touch sensing function at the same time.

When one light-emitting device 13 is an organic light-emitting diode (OLED), the light-emitting device 13 may include a light-emitting layer 132. For example, along the direction Z perpendicular to the plane where the substrate 12 is located, the light-emitting device 13 may include an anode 131, the light-emitting layer 132, and the cathode 133 sequentially stacked in layers. Light-emitting layers 132 of the light-emitting devices 13 may be denoted as the light-emitting region 10 of the display panel 100. When the display panel 100 is an OLED display panel 100, the film layer structure of the display panel may include a pixel definition layer (PDL). At least a portion of the material of the light-emitting devices 13 may be disposed in an opening area of the PDL, and therefore the area corresponding to the opening area of the PDL may be denoted as the light-emitting region of the display panel 100. When the display panel 100 is a micro light-emitting diode (Micro LED) display panel 100, the area where the Micro LEDs are located may be denoted as the light-emitting area of the display panel 100.

As shown in FIG. 2 and FIG. 5, in one embodiment, the display panel 100 may include display units 20., and each display unit 20 may include at least two light-emitting devices 13. The display panel 100 may include a first display region B. The first display region B may include m display units 20 and n photosensitive devices 14, where m and n are positive integers and m>n.

In the present embodiment, the display panel 100 may include the display units 20., and each display unit 20 may include at least two light-emitting devices 13. The present disclosure has no limit on the quantity of the light-emitting devices 13 included in each display unit. For example, each display unit 20 may include two light-emitting devices 13. Or, each display unit 20 may be configured to include three, four or more light-emitting devices 13 according to actual needs.

The display panel 100 may include the first display region B, and the first display region B may be the entire display region of the display panel 100 or may be a portion of the display region of the display panel 100. The present disclosure has no limit on the portion of the region occupied by the first display region B in the display panel 100. As shown in FIG. 5, in one optional configuration, the first display region B of the display panel 100 may include m display units 20, and also n photosensitive devices 14 are set in the first display region B at the same time. Further, the number m of display units 20 in the first display region B may be configured to be larger than the number n of the photosensitive devices 14 in this region. That is to say, the number of display units 20 in the first display region B may be larger than the number of photosensitive devices 14 in the first display region B. In the present embodiment, by setting the number of display units 20 in the first display region B to be larger than the number of photosensitive devices 14 in the first display region B, the display pixels per inch (PPI) of the display panel 100 may be higher than the touch PPI, to ensure that the display panel 100 has a good display effect and has a touch sensing function at the same time.

In the display panel, a minimum light-emitting unit may be regarded as a sub-pixel, and each sub-pixel may only emit light of a single color (such as red, blue, or green). A sub-pixel that emits red light may be called a red sub-pixel, a sub-pixel that emits green light may be called a green sub-pixel, and a sub-pixel that emits blue light may be called a blue sub-pixel. The sub-pixels in the display panel may be arranged in various ways. In one embodiment shown in FIG. 5, each display unit 20 may include two light-emitting devices 13. For example, each display unit 20 may include a green light-emitting device 31 and a red (or blue) light-emitting device. Display units 20, each of which includes a red light-emitting device 32 and a blue light-emitting device 33 may be arranged at intervals in the horizontal direction and the vertical direction. Since the three primary colors of RGB (red, green and blue) are necessary to constitute all colors, two colors cannot constitute all colors. Therefore, when the display panel 100 actually displays images, in the arrangement of the light-emitting devices 13 shown in FIG. 5, each light-emitting device 13 may borrow the light-emitting points of its surrounding light-emitting devices 13 to form the RGB three primary colors, which may also be called borrowed colors. A display unit 201 shown in FIG. 5 may include a red light-emitting device 32 and a green light-emitting device 31, and the blue light-emitting device 33 can be borrowed (shared) from an adjacent display unit 202. Here, the blue light-emitting device 33 in the display unit 202 may be called a compensation sub-pixel of the display unit 201. One display unit 20 may share the light-emitting devices 13 (sub-pixels) with a plurality of display units 20. For example, the display unit 201 may also share the blue light-emitting device 33 with the display unit 203, and the display unit 202 may also share the red light-emitting device 32 with the display unit 204.

In various embodiments, the sub-pixels may be also arranged in other suitable manners which are not listed here.

As shown in FIG. 2, FIG. 3, and FIG. 5, when the number of the display units 20 in the first display region B of the display panel 100 is larger than the number of the photosensitive devices 14, in one embodiment, the touch electrodes 15 may include electrode lines 151, and the electrode lines 151 may be located in the non-light-emitting region 11. The electrode lines 151 may include first electrode lines 1511 extending along the first direction Y1 and second electrode lines 1512 extending along the second direction Y2. The first direction Y1 may intersect the second direction Y2; the first electrode lines 1511 and the second electrode lines 1512 may intersect to define first sub-display regions 41, and at least one first sub-display region 41 may include one of the photosensitive devices 14.

The touch electrodes 15 may include the electrode lines 151, and the electrode lines 151 may be disposed in the non-light-emitting region 11, to prevent the touch electrodes 15 from blocking the output light from the light-emitting devices 13 in the light-emitting region 10 of the display panel 100 and ensure a good display performance of the display panel 100. The electrode lines 151 may include the first electrode lines 1511 extending along the first direction Y1 and the second electrode lines 1512 extending along the second direction Y2. The first electrode lines 1511 and the second electrode lines 1512 extending along different directions may intersect to define the first sub-display regions 41, and the photosensitive devices 14 may be disposed in the first sub-display regions 41. Since the touch electrodes 15 may be disposed on the side of the photosensitive devices 14 away from the substrate 12, by providing the photosensitive devices 14 in the first sub-display regions defined by the intersections of the first electrode lines 1511 and the second electrode lines 1512 of the touch electrodes 15, along the direction Z perpendicular to the plane where the substrate 12 is located, no overlapping area may be included between the touch electrodes 15 and the photosensitive devices 14. Therefore, the arrangement of the touch electrodes 15 may be prevented from having a negative impact on the photosensitive area and the photosensitive effect of the photosensitive devices 14, to improve the touch effect and touch accuracy of the display panel 100.

When the electrode lines 151 include the first electrode lines 1511 extending along the first direction Y1 and the second electrode lines 1512 extending along the second direction Y2, the corresponding display units 20 in this area may be disposed along the third direction Y3. The third direction Y3 may intersect both the first direction Y1 and the second direction Y2. The present embodiment with the arrangement of the display units 20, electrode lines 151, photosensitive devices 14, etc., in the display panel 100 is used as an example only to illustrate the present disclosure, and does not limit the scopes of the present disclosure. Further, in one embodiment, the touch electrodes 15 may include, for example, a plurality of electrode rows extending along the third direction Y3, and electrode columns extending perpendicular to the third direction Y3. Each electrode row or electrode column may include a plurality of sub-electrode blocks connected in series, and each sub-electrode block may include the aforementioned first electrode lines 1511 extending along the first direction Y1 and the second electrode lines 1512 extending along the second direction Y2.

Figure 7:
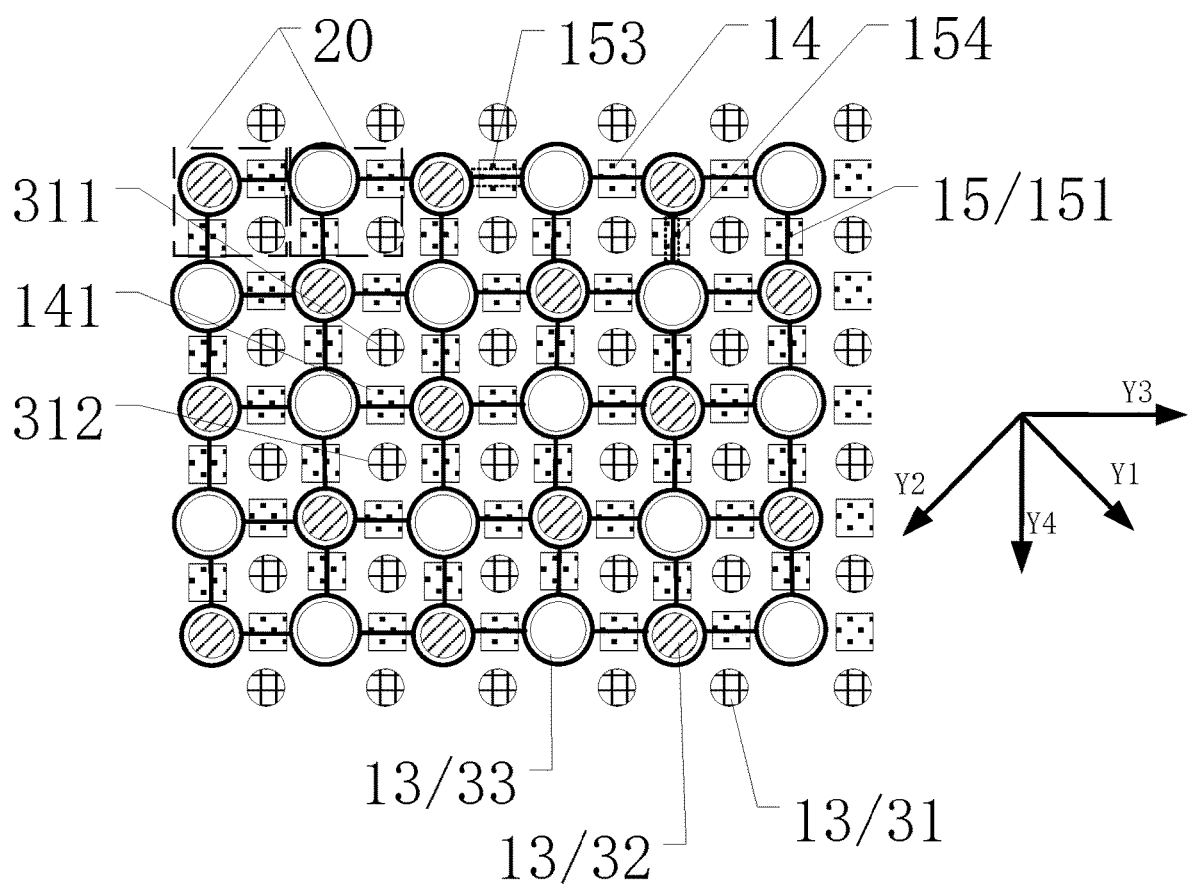
FIG. 7 illustrates another enlarged view of a B region of the display panel in FIG. 2, consistent with various disclosed embodiments of the present disclosure.
Figure 8:
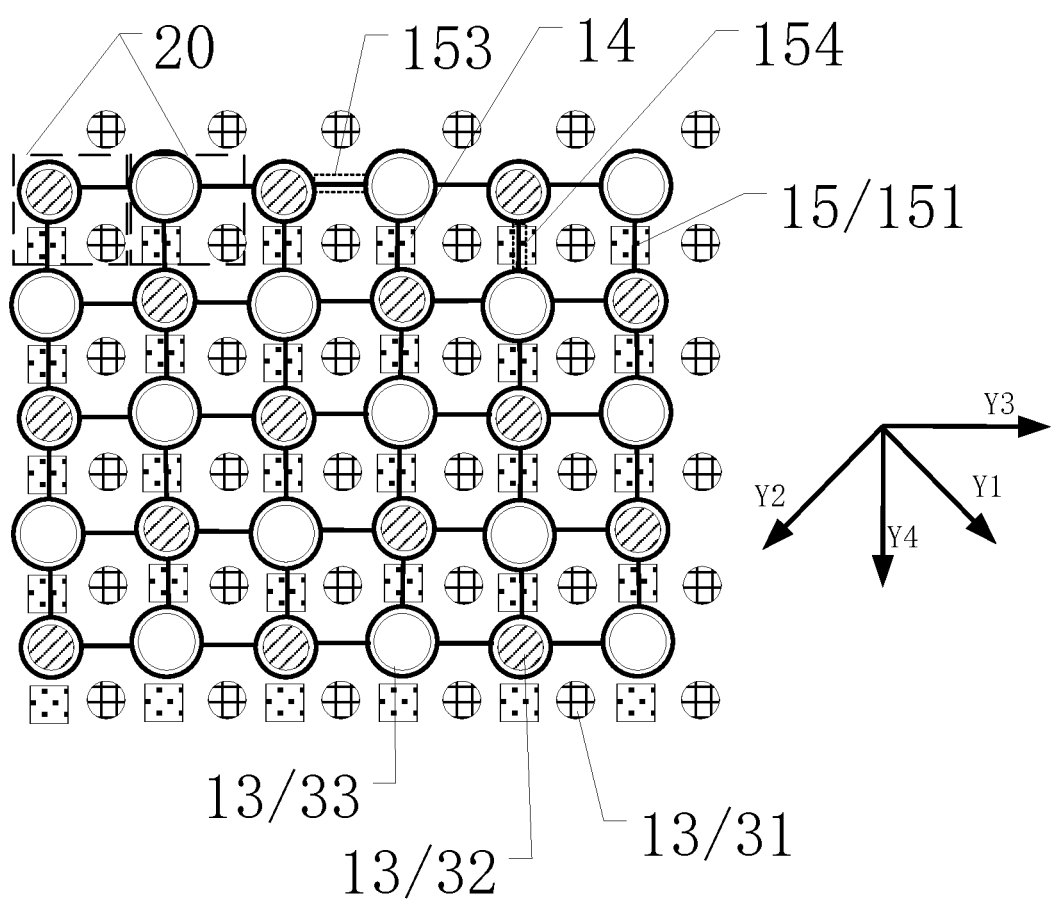
FIG. 8 illustrates another enlarged view of a B region of the display panel in FIG. 2, consistent with various disclosed embodiments of the present disclosure.

FIG. 7 shows another enlarged view of the B area in FIG. 2 in another embodiment, and FIG. 8 shows another enlarged view of the B area in FIG. 2 in another embodiment. As shown in FIG. 2, and FIG. 6 to FIG. 8, optionally, the display panel 100 may include the display units 20, and each display unit 20 may include at least two light-emitting devices 13. The display panel 100 may include a first display region B, and the first display region B may include m display units 20, and the first display region B may also include n photosensitive devices 14, where m and n are positive integers and m≤n.

In the present embodiment, the display panel 100 may include the display units 20, and each display unit 20 may include at least two light-emitting devices 13. The present disclosure has no limit on the number of light-emitting devices 13 included in one display unit 20. For example, in one embodiment, only two light-emitting devices 13 may be configured to be included in one display unit 20. Or, in some other embodiments, three, four, or more light-emitting devices 13 may be configured to be included in one display unit 20 according to requirements.

The display panel 100 may include the first display region B. The first display region B may be the entire display region of the display panel 100 or may be a portion of the display region of the display panel 100. The proportion of the area occupied by the first display region B in the display panel 100 is not specifically limited in the present disclosure. In one embodiment, the first display region B of the display panel 100 may be provided with m display units 20, and n photosensitive devices 14 may be disposed in the first display region B at the same time. Further, the number m of the display units 20 in the first display region B may be configured to be less than or equal to the number n of the photosensitive devices 14 in this area. That is, the number m of the display units 20 in the first display region B may be equal to the number of photosensitive devices 14 as shown in FIG. 6 and FIG. 8, the number of the display units 20 in the first display region B may be less than the number of photosensitive devices 14 as shown in FIG. 7. Therefore, by configuring the number of the display units 20 in the first display region B to be equal to or less than the number of the photosensitive devices 14, the touch PPI may be configured to be the same as or be higher than the display PPI, to ensure that the display panel 100 has a good display effect and improve the control accuracy of the touch function of the touch panel at the same time.

Figure 9:
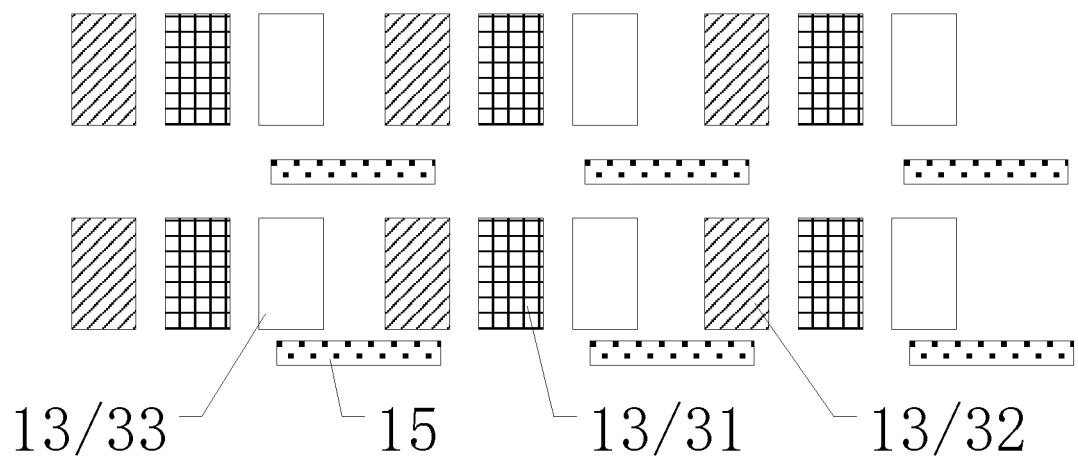
FIG. 9 illustrates an exemplary arrangement of light-emitting devices and photosensitive devices, consistent with various disclosed embodiments of the present disclosure.
Figure 10:
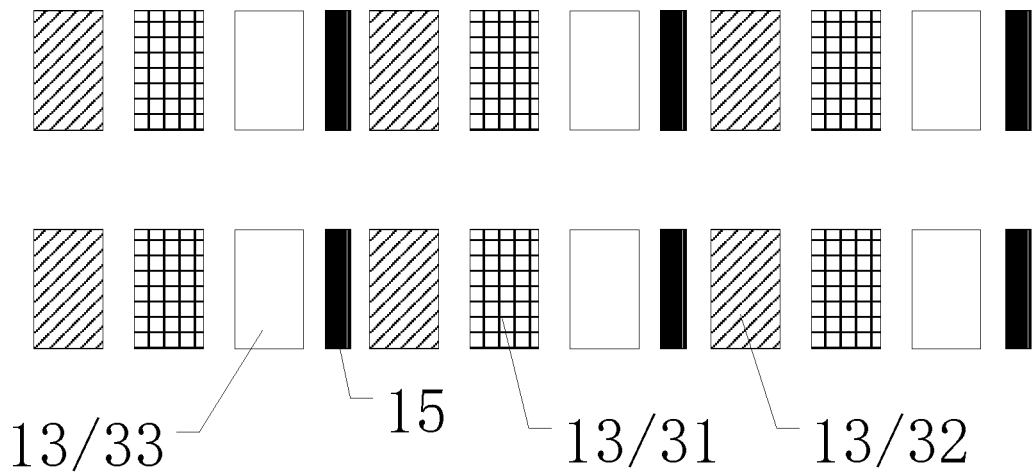
FIG. 10 illustrates another exemplary arrangement of light-emitting devices and photosensitive devices, consistent with various disclosed embodiments of the present disclosure.

FIG. 9 shows an arrangement of the light-emitting devices and the photosensitive devices in one embodiment, and FIG. 10 shows another arrangement of the light-emitting devices and the photosensitive devices in another embodiment. As shown in FIG. 2, FIG. 6 to FIG. 8, FIG. 9 and FIG. 10, in one embodiment, when the display units 20 and the photosensitive units in the display panel 100 are set at a ratio of 1:1, the setting principle may be that a position with the largest distance from two adjacent light source pixels (generally green light-emitting devices 31) may be found to set one corresponding photosensitive device 14. Therefore, in one optional arrangement of the display units 20 and photosensitive devices 14 shown in FIG. 9 or FIG. 10, each display unit 20 may include three light-emitting devices 13 with different colors. It should be noted that there are many other arrangements of the sub-pixels in the display panel 100, which will not be illustrated here one by one.

As shown in FIG. 2, FIG. 4, FIG. 6, and FIG. 7, when the number of the display units 20 in the first display region B of the display panel 100 is smaller than or equal to the number of the photosensitive devices 14 in the first display region B, in one embodiment, the touch electrodes 15 may include electrode lines 151, and the electrode lines 151 may be located in the non-light-emitting region 11. The display units 20 may be arranged along the third direction Y3, and the electrode lines 151 may include third electrode lines 153 extending along the third direction Y3. The third electrode lines 153 may overlap the corresponding photosensitive devices 14 along a direction perpendicular to the plane where the display panel 100 is located.

The touch electrodes 15 in the display panel 100 may include the touch electrode lines 151. At this time, the touch electrode lines 151 included in the touch electrodes 15 may be disposed in the non-light-emitting region 11 of the display panel 100, to prevent the setting of the touch electrodes 15 from blocking the light emitted by the light-emitting devices 13 in the light-emitting region 10 of the display panel 100. A good display effect of the display panel 100 may be ensured. When the display units 20 are arranged along the third direction Y3 as an example, the touch electrode lines 151 may also include third electrode lines 153 extending along the third direction Y3. At the same time, the third electrode lines 153 may overlap the corresponding photosensitive devices 14 along the direction perpendicular to the plane where the display panel 100 is located. That is, there may be overlapping areas between at least part of the photosensitive devices 14 and the touch electrodes 15. There may be no need to avoid the setting position of the touch electrode lines 151 to set the photosensitive devices 14, which may make the number of photosensitive devices 14 arranged in the first display region B of the display panel 100 larger. By setting the number of photosensitive devices 14 in the first display region B to be equal to or larger than the number of display units 20, the touch accuracy of the display panel 100 may be improved. That is, to improve the touch PPI, orthographic projections of the touch electrodes 15 and the photosensitive devices 14 may have overlap, and the third electrode line s153 overlapping the photosensitive devices 14 may not have a large width, to ensure that the photosensitive devices 14 with the overlapping areas have a good touch photosensitive effect.

As shown in FIG. 2, FIG. 4 and FIG. 6 to FIG. 7, in one embodiment, one light-emitting device 13 may include a first light-emitting device 311 and a second light-emitting device 312 with a same light-emitting color. One corresponding photosensitive device 14 may include a first photosensitive device 141. Along a fourth direction Y4, the first photosensitive device 141 may be disposed between the first light-emitting device 311 and the second light-emitting device 312. Further, the first photosensitive device 141 may at least partially overlap the first light-emitting device 311 along the fourth direction, and the first photosensitive device 141 may at least partially overlap the second light-emitting device 312 along the fourth direction. The fourth direction Y4 may be a direction from the first light-emitting device 311 to the second light-emitting device 312. The fourth direction Y4 may intersect the third direction Y3.

When there are overlapping areas between the third electrode lines 153 and the corresponding photosensitive devices 14 in the first display region B along the direction Z perpendicular to the plane where the substrate 12 is located, in one optional embodiment, one light-emitting device 13 in the display panel 100 may include one first light-emitting device 311 and one second light-emitting device 312 with the same light-emitting color. One corresponding photosensitive device 14 may include one first photosensitive device 141. Along the fourth direction Y4 intersecting the third direction Y3, the first photosensitive device 141 may be disposed between the first light-emitting device 311 and the second light-emitting device 312 with the same light-emitting color adjacent to each other. Further, the first photosensitive device 141 may at least partially overlap the first light-emitting device 311 along the fourth direction, and the first photosensitive device 141 may at least partially overlap the second light-emitting device 312 along the fourth direction. That is, when the number of light-sensing devices 14 is equal to or larger than the number of display units 20, along the fourth direction Y4, the first photosensitive device 141 may be located in the first light-emitting device 311 and the second light-emitting device 311 with the same light-emitting color arranged along the fourth direction Y4. This arrangement may avoid the overlapping area between the first light-emitting device 311 and/or the second light-emitting device 312 and the first photosensitive device 141 along the direction perpendicular to the plane where the display panel 100 is located, to avoid the impact of the setting of the first light-emitting device 311 and/or the second light-emitting device 312 on the photosensitive region of the first photosensitive device 141, ensure the touch sensing effect of the first photosensitive device 141, and improve the touch effect of the corresponding display device of the display panel 100.

The embodiment shown in FIG. 6 with the third electrode lines 153, the first photosensitive devices 141, the first light-emitting devices 311 and the second light-emitting devices 312 of the same light-emitting color in the first display region B of the display panel 100, is used as an example only to illustrate the present disclosure. In another embodiment shown in FIG. 8, the first display region B may also include fourth electrode lines 154 extending in the fourth direction Y4. One photosensitive device 14 may be disposed between the first light-emitting device 311 and the second light-emitting device 312 of the same light-emitting color adjacently disposed along the third direction Y3. The photosensitive device 14 may have an overlapping area with the first light-emitting device 311 and an overlapping area with the second light-emitting device 312. One photosensitive device 14 may be disposed between one first light-emitting device 311 and one corresponding second light-emitting device 312 of the same light-emitting color adjacently disposed along the fourth direction Y4. Further, one photosensitive device 14 may be also disposed between one first light-emitting device 311 and one corresponding second light-emitting device 312 of the same light-emitting color adjacently disposed along the third direction Y3, to improve the photosensitive effect of the first display region B in the display panel 100 and enhance the touch-sensing effect of the display panel 100.

Figure 11:
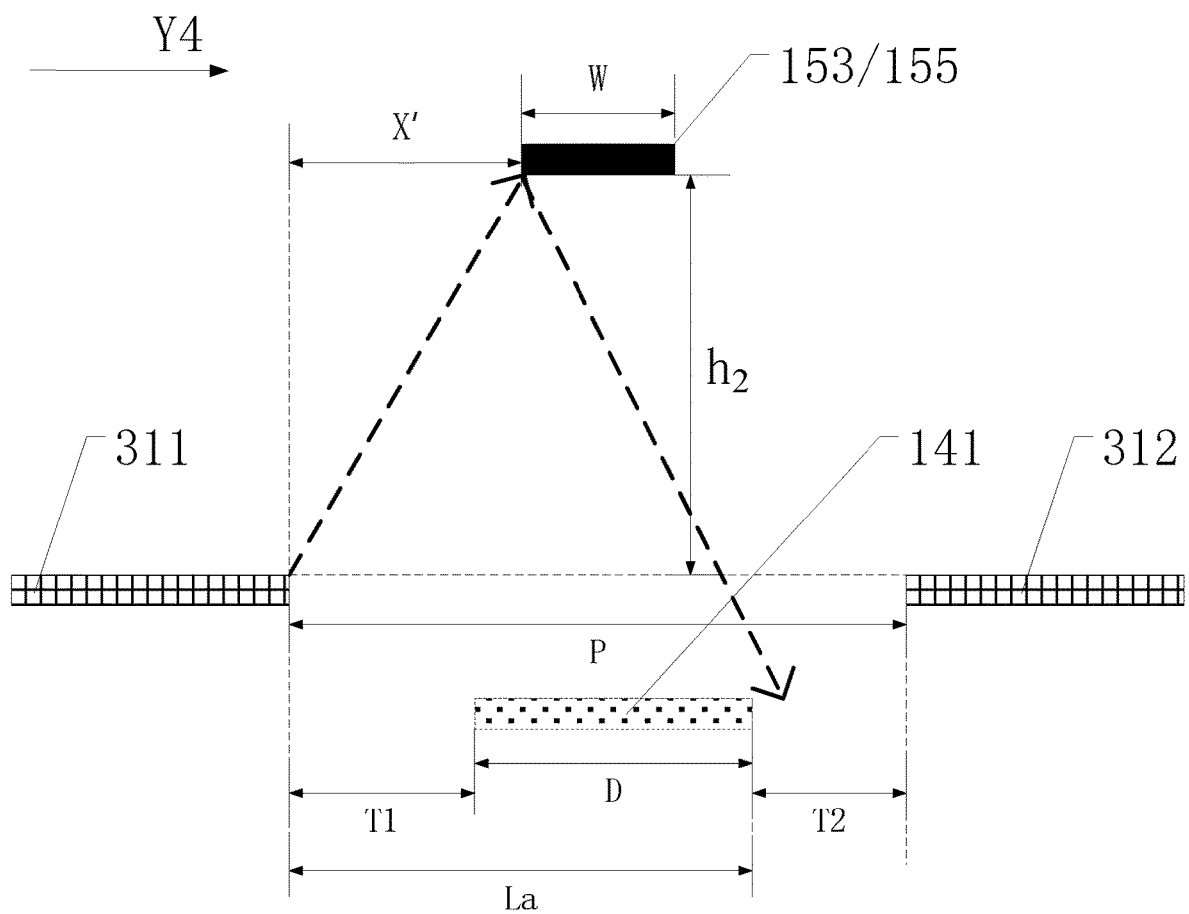
FIG. 11 illustrates a cross-sectional view of the display panel along a CC' direction in FIG. 6, consistent with various disclosed embodiments of the present disclosure.

FIG. 11 is a cross-sectional view along CC' in FIG. 6 in another embodiment. As shown in FIG. 2, FIG. 4, FIG. 6, and FIG. 11, optionally, one third electrode line 153 may include a third sub-electrode line 155, and the third sub-electrode line 155 may overlap with one corresponding first photosensitive device 141. Along the fourth direction Y4, a distance from the third sub-electrode line 155 to the corresponding first light-emitting device 311 is X', with $X_{min} \leq X' \leq X_{max}$, where $X_{min}=(P+D)/4\times h_2/h_3$, $X_{max}=(P-W)/2$, $h_3=(La\times h_2)/2X'$, P is a distance between the first light-emitting device 311 and the second light-emitting device 312 along the fourth direction Y4, D is the size of the photosensitive device 14 along the fourth direction Y4, W is the width of the third sub-electrode line 155 along the fourth direction Y4, $h_2$ is a distance between the side surface of the light-emitting device 13 away from the substrate 12 and the side surface of the third sub-electrode line 155 facing the substrate 12 along the direction Z perpendicular to the substrate 12, and La is the distance between the side of the first light-emitting device 311 facing the first photosensitive device 141 and the side of the first photosensitive device 141 away from the first light-emitting device 311 along the fourth direction Y4.

In the embodiment shown in FIG. 6 and FIG. 11, optionally, one third electrode line 153 may include one third sub-electrode line 155, and the third sub-electrode line 155 may be one third electrode line 153 having an overlapping area with one corresponding first photosensitive device 141 along the direction Z perpendicular to the plane where the substrate 12 is located. By setting the distance between the third sub-electrode line 155 to the adjacent first light-emitting device 311 (or the second light-emitting device 312) and the position relationship between the third sub-electrode line 155, the first light-emitting device 311, the second light-emitting device 312, and the first photosensitive device 141, according to above equations, the third sub-electrode line 155 may traverse through the middle of the first light-emitting device 311 and the second light-emitting device 312 in the fourth direction Y4, and may have an overlapping area with the first light-sensitive device 141. Therefore, the light emitted by the first light-emitting device 311 and the second light-emitting device 312 during operation may be prevented from internal reflection and directly entering the photosensitive device when irradiating the lower surface of the third sub-electrode line 155, and the device may be prevented from being saturated and unable to work because of receiving light reflected by the light-emitting device 13. That is, in the present embodiment, the positional relationship between the third sub-electrode line 155, the first photosensitive device 141, the first light-emitting device 311, and the second light-emitting device 312 may be adjusted to prevent the light emitted by the light-emitting device 13 from being reflected by the touch electrodes 15 to the photosensitive device 14. Correspondingly, the photosensitive device 14 may only receive the light related to the touch operation, that is, receive the light reflected back by the touch object toward the side of the display panel 100 with the substrate 12, which is beneficial to improve the touch sensing effect of the display device corresponding to the display panel 100.

As shown in FIG. 2, FIG. 4, FIG. 6, and FIG. 11, in another embodiment, one third electrode line 153 may include a third sub-electrode line 155, and the third sub-electrode line 155 may overlap with one corresponding first photosensitive device 141. The third sub-electrode line 155 may be located on the midperpendicular line of the line connecting the first light-emitting device 311 and the second light-emitting device 312.

In the embodiment shown in FIG. 6 and FIG. 11, optionally, one third electrode line 153 may include one third sub-electrode line 155, and the third sub-electrode line 155 may be one third electrode line 153 having an overlapping area with one corresponding first photosensitive device 141 along the direction Z perpendicular to the plane where the substrate 12 is located. The third sub-electrode line 155 may be located on the midperpendicular line of the line connecting the first light-emitting device 311 and the second light-emitting device 312 adjacently disposed along the fourth direction Y4, such that every position on the third sub-electrode line 155 has the same distance from the first light-emitting device 311 and the second light-emitting device 312 arranged adjacently. Correspondingly, a portion of the side of the third sub-electrode line 155 facing the substrate 12 may be prevented from receiving the light emitted by the first light-emitting device 311 or the second light-emitting device 312. That is, in the present embodiment, the positional relationship between the third sub-electrode line 155, the first photosensitive device 141, the first light-emitting device 311, and the second light-emitting device 312 may be adjusted such that the third sub-electrode line 155 runs laterally from the middle of the first light-emitting device 311 and the second light-emitting device 312 in the fourth direction Y4, that is, the distance T1 between the first light-emitting device 311 and the third sub-electrode line 155 is set equal to the distance T2 between the second light-emitting device 312 and the third sub-electrode line 155, and there may be an overlapping area between the third sub-electrode line 155 and the first photosensitive device 141. Therefore, the light emitted by the first light-emitting device 311 and the second light-emitting device 312 during operation may be prevented from internal reflection and directly entering the photosensitive device when irradiating the lower surface of the third sub-electrode line 155, and the device may be prevented from being saturated and unable to work because of receiving light reflected by the light-emitting device 13. That is, the light emitted by the light-emitting device 13 may be prevented from irradiating the photosensitive device 14. Correspondingly, the photosensitive device 14 may only receive the light related to the touch operation, that is, receive the light reflected back by the touch object toward the side of the display panel 100 with the substrate 12, which is beneficial to improve the touch sensing effect of the display device corresponding to the display panel 100.

As shown in FIG. 2, FIG. 4, FIG. 6, and FIG. 11, in one embodiment, the light-emitting color of the first light-emitting device 311 and the second light-emitting device 312 may be green.

In one embodiment, when one photosensitive device 14 is located between one corresponding first light-emitting device 311 and one corresponding second light-emitting device 312 disposed adjacently with same light-emitting color, the light-emitting color of the first light-emitting device 311 and the second light-emitting device 312 may be configured to be green. In the fingerprint identification under the screen, a green light-emitting device 31 may be mainly used as the light source, or a green light-emitting device 31 may be used as the main part of the light source. In the present embodiment, the light-emitting color of the first light-emitting device 311 and the second light-emitting device 312 may be configured to be green, and the photosensitive device 14 may be disposed between the first light-emitting device 311 and the second light-emitting device 312 along the fourth direction Y4. Therefore, the green light emitted by the green light-emitting device 31 may be emitted to the touch body (such as the user's finger), and at least part of the green light reflected by the touch body may be received by the first photosensitive device 141, thereby realizing the recognition of the touch operation of the touch body. That is to say, the present embodiment may use the green light-emitting device 31 as the light source for fingerprint identification at this time.

Furthermore, when the light-emitting device 13 is used as a fingerprint recognition light source, in general, the green light-emitting device 31 may be needed to emit light, and whether the blue light-emitting device 33 and the red light-emitting device 32 usually included in the display panel 100 emit light may be optional. Therefore, disposing the first photosensitive device 141 between two adjacent green light-emitting devices 31 may be beneficial to ensure the touch sensing function of the display device related to the display panel 100.

Figure 12:
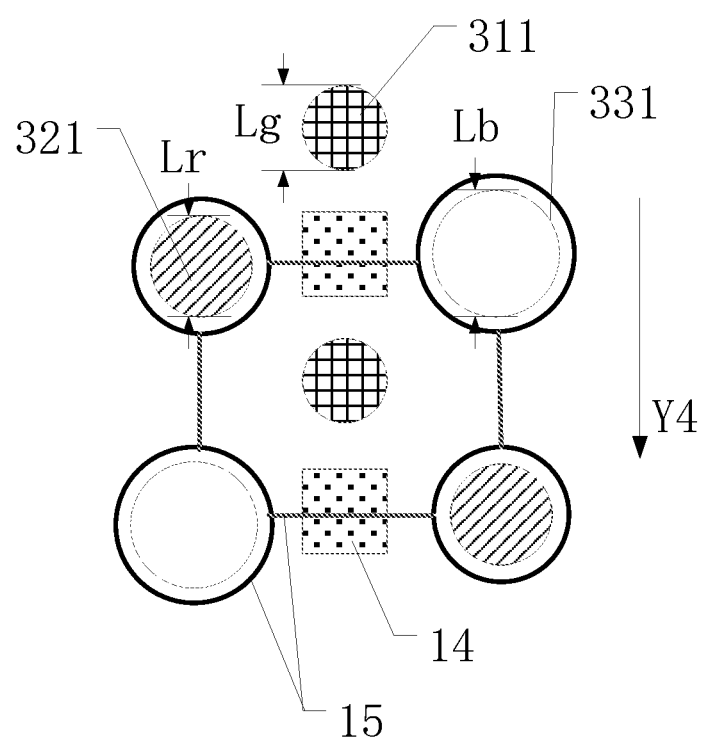
FIG. 12 illustrates a local enlarged view of the display panel in FIG. 6, consistent with various disclosed embodiments of the present disclosure.

FIG. 12 is a partially enlarged view of FIG. 6. In one embodiment, as shown in FIG. 2, FIG. 4, FIG. 6, and FIG. 12, optionally, one light-emitting device 13 may further include a third light-emitting device 321 and a fourth light-emitting device 331. The third light-emitting device 321, the fourth light-emitting device 331, and the first light-emitting device 311 may have different light-emitting colors.

Along the fourth direction Y4, the opening size of the first light-emitting device 311 is Lg, the opening size of the third light-emitting device 321 is Lr, and the opening size of the fourth light-emitting device 331 is Lb, where Lg=(Lr+Lb)/2.

The display panel 100 includes at least three types of light-emitting devices 13 with different colors. The display panel 100 may include the first light-emitting devices 311 and the second light-emitting devices 312 with the same light-emitting color. Based on that, the display panel 100 may further include third light-emitting devices 321 and fourth light-emitting devices 331. The third light-emitting devices 321, the fourth light-emitting devices 331, and the first light-emitting devices 311 may have different light-emitting colors respectively. For example, the light-emitting color of the first light-emitting device 311 may be selected to be green, and the light-emitting color of the third light-emitting devices 321 and the fourth light-emitting devices 331 may be red or blue. Based on this, along the fourth direction Y4, the opening size of the green light-emitting devices 31 (the first light-emitting devices 311) may be selected to be half of the sum of the opening size of the red light-emitting devices 32 (the third light-emitting device 321) and the opening size of the blue light-emitting devices 33 (the fourth light-emitting devices 331). Along the direction perpendicular to the plane where the display panel 100 is located, between the red light-emitting devices 32 and the blue light-emitting devices 33, there may be the touch electrodes 15 respectively surrounding the red light-emitting devices 32 and the blue light-emitting devices 33. Therefore, by setting the opening size of the green light-emitting devices 31 to be relatively small, overlapping between the green light-emitting devices 31 and the touch electrodes 15 arranged around the red light-emitting devices 32 and the blue light-emitting devices 33 may be avoided, to avoid the impact of the setting of the touch electrodes 15 on the light-emitting region of the green light-emitting devices 33. Also, the light emitted by the green light-emitting devices 31 may be prevented from irradiating too much on the touch electrodes 15 surrounding the red light-emitting devices 32 and the blue light-emitting devices 33 after being reflected by the touch electrodes 15, and be prevented from affecting the display color of the corresponding region of the red light-emitting devices 32 and/or blue light-emitting devices 33, to avoid the problem of light mixing. Also, the green light-emitting devices 31 may be prevented from being too small to meet the cooperative display effect of the red light-emitting devices 32 and the blue light-emitting devices 33 arranged around them. At the same time, their illumination effect as a fingerprint recognition light source and the touch effect of the corresponding display device may be ensured.

Further, as shown in FIG. 6, the light-emitting devices 13 in the display panel 100 provided by the present embodiment may be arranged in a diamond arrangement, such that the spacing between the light-emitting devices 13 is smaller and the display panel 100 has a higher display PPI. Correspondingly, the resolution of the display panel 100 may be increased to improve user experience.

Figure 13:
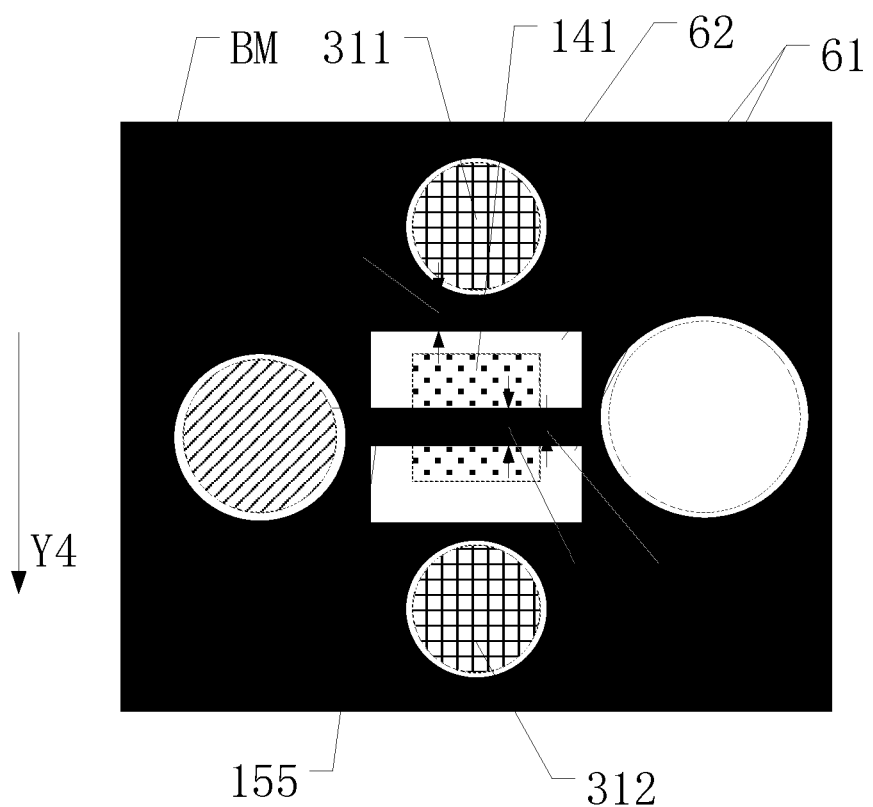
FIG. 13 illustrates a partial perspective view of an exemplary display panel consistent with various disclosed embodiments of the present disclosure.

FIG. 13 is a partial perspective view of the display panel provided by one embodiment of the present disclosure. As shown in FIG. 13 in conjunction with FIG. 2, FIG. 4, FIG. 6, and FIG. 12, optionally, the third electrode lines 153 may include third sub-electrode lines 155 overlapping the corresponding first photosensitive devices 141; and the display panel 100 may also include a light-shielding layer BM. Along the direction Z perpendicular to the plane where the substrate 12 is located, the light-shielding layer BM may be at a side of the touch electrodes 15 away from the substrate 12. Along the direction Z perpendicular to the plane of the substrate 12, the light-shielding layer BM may at least partially overlap the third sub-electrode lines 155.

For example, in the embodiment shown in FIG. 6, the third electrode lines 153 may include the third sub-electrode line 155, and the third sub-electrode lines 155 may be electrode lines 151 having an overlapping area with the corresponding first photosensitive devices 141 along the direction Z perpendicular to the plane where the substrate 12 is located. As shown in FIG. 4 and FIG. 13, the film layer structure of the display panel 100 may include a light-shielding layer BM. Along the direction Z perpendicular to the plane where the substrate 12 is located, the touch electrodes 15 may be disposed on a side of the film layer where the light-emitting devices 13 are located away from the substrate. The light-shielding layer BM may be selectively disposed on the side of the touch electrodes 15 away from the substrate 12. At this time, to ensure that the first photosensitive devices 141 has a good photosensitive effect, it may be necessary to set the photosensitive area of the first photosensitive devices 141 to be large enough. Therefore, the light-shielding layer BM in the corresponding area of the first photosensitive devices 141 may be provided with openings for touching and reflecting light to the surface of the first photosensitive devices 141. Since the third sub-electrode lines 155 of the touch electrodes 15 may overlap with the first photosensitive devices 141, when the light on the side of the light-emitting surface of the display panel 100 irradiates the side of the substrate 12, if the surface of the third sub-electrode lines far away from the substrate 12 is irradiated, the third sub-electrode lines may reflect this part of the light to the side of the light-emitting surface of the display panel 100, and this part of the reflected light may affect the display effect of the display panel 100. Therefore, in the present disclosure, along the direction Z perpendicular to the plane where the substrate 12 is located, at least a partial overlapping area between the light-shielding layer BM and the third sub-electrode lines 155 may be provided, to reduce the amount of the light that irradiates the surface of the third sub-electrode lines far away from the substrate 12 when the light on the side of the light-emitting surface of the display panel 100 irradiates the side of the substrate 12. In one embodiment, the third sub-electrode lines 155 may be configured to be completely covered by the light-shielding layer BM, that is, as shown in FIG. 13, the area of the light-shielding layer BM may be configured to be larger than the area of the corresponding third sub-electrode lines 155, such that the light-shielding layer BM completely covers the third sub-electrode lines 155. Therefore, the light that irradiates the surface of the third sub-electrode lines far away from the substrate 12 when the light on the side of the light-emitting surface of the display panel 100 irradiates the side of the substrate 12 may be eliminated, and the surface of the third sub-electrode lines far away from the substrate 12 may not reflect the light to the light-emitting surface of the display panel 100, to achieve a good display effect on the basis of the display panel 100 having high display PPI and high touch PPI.

As shown in FIG. 2, FIG. 4, FIG. 6, FIG. 12, and FIG. 13, in one embodiment, along the direction Z perpendicular to the plane where the substrate 12 is located, the light shielding layer BM may include first light-transmission holes 61 and second light-transmission holes 62 penetrating through its thickness. The first light-transmission holes 61 may at least partially overlap the photosensitive devices 14, and the second light-transmission holes 61 may at least partially overlap the photosensitive devices 14. Along the fourth direction Y4, the first light-transmission holes 61 may be located between the first light-emitting devices 311 and the third sub-electrode lines 155. Along the fourth direction Y4, the distance between the first light-transmission holes 61 and the adjacent second light-transmission holes 62 may be W1, and the opening size of the first light-transmission holes 61 may be W2, where W2>W1.

In one embodiment, along the direction Z perpendicular to the plane where the substrate 12 is located, the light shielding layer BM may be disposed on the side of the touch electrodes 15 away from the substrate 12. Along the direction Z perpendicular to the plane where the substrate 12 is located, the light shielding layer BM may include two types of light-transmission holes penetrating through its thickness. The two types of light-transmission holes may include first light-transmission holes 61 and second light-transmission holes 62. The first light-transmission holes 61 may optionally at least partially overlap the corresponding photosensitive devices 14 in the thickness direction of the display panel 100, such that the light received by the surface of the touch body may be able to pass through the first light-transmission holes 61 and be emitted toward the surface of the corresponding photosensitive devices 14 after being reflected. The second light-transmission holes 62 may optionally at least partially overlap the corresponding photosensitive devices 14 in the thickness direction of the display panel 100, so that the light emitted by the light-emitting devices 13 of the display device may be able to be emitted to the side of the light-emitting surface of the display panel 100 through the second light-transmission holes 62.

Further, along the direction Z perpendicular to the plane where the substrate 12 is located, the light-shielding layer BM may include the second light-transmission holes 62 through which the light emitted by the light-emitting devices 13 passes through, such that the light emitted by the light-emitting devices 13 of each color may be able to be emitted from the corresponding second light-transmission holes 62. That is, the setting of the light-shielding layer BM may be used to avoid the problem of light mixing between the light-emitting devices 13 of each color, and ensure the display effect of the display panel 100. To make the display panel 100 have a good touch function on the basis of the good display effect, in the present disclosure, the first photosensitive devices 141 may be disposed between the first light-emitting devices 311 and the second light-emitting devices 312 along the fourth direction Y4, and the light-shielding layer BM may include the first light-transmission holes 61 exposing the first photosensitive devices 14. When the light emitted by the fingerprint identification light source (such as the first light-emitting devices 311) is emitted to the touch body (such as the user's finger), at least part of the light reflected by the touch body may be able to pass through the first light-transmission holes 61 and then may be received by the first photosensitive devices 141, to realize the recognition of the touch operation of the touch body. Further, along the fourth direction Y4, the first light-transmission holes 61 may be disposed between the first light-emitting devices 311 and the third sub-electrode lines 155. Along the fourth direction Y4, the distance between the first light-transmission holes 61 and the adjacent second light-transmission holes 62 may be W1, and the opening size of the first light-transmission holes 61 may be W2. By setting W2>W1, the second light-transmission holes 62 may have a sufficiently large light-transmission size in a limited space, to improve the touch effect of the display device related to the display panel 100 and ensure that the light-shielding layer BM surrounds each light-emitting device 13. The problem of light mixing among the light-emitting devices 13 of each color may be avoided, to ensure a good display effect of the display panel 100.

In one embodiment. W2 may be larger than or equal to 8 μm.

As shown in FIG. 2, FIG. 4, FIG. 6, FIG. 12, and FIG. 13, optionally, along the fourth direction Y4, there may be at least two first light-transmission holes 61 between one first light-emitting device 311 and one corresponding second light-emitting device 312. A distance between the at least two first light-transmission holes 61 may be W3 where W3>W and W is a width of the third sub-electrode lines 155 along the fourth direction Y4.

In the present embodiment, optionally, as shown in FIG. 13, along the fourth direction Y4, two first light-transmission holes 61 may be disposed between one first light-emitting device 311 and one corresponding second light-emitting device 312 of the same light-emitting color disposed adjacently. The two first light-transmission holes 61 may be respectively disposed at two sides of the light-shielding layer BM corresponding to the corresponding third sub-electrode line 155. That is, along the direction Z perpendicular to the plane where the substrate 12 is located, the light-shielding layer BM may at least partially overlap the third sub-electrode lines 155, to reduce or even eliminate the light irradiated on the third sub-electrode lines 155 when the light from the light-emitting surface side of the display panel 100 is irradiated to the side of the substrate 12. Further, along the fourth direction Y4, the distance W3 between the two first light-transmission holes 61 included between the first light-emitting device 311 and the second light-emitting device 312 may be configured to be larger than the width W of the corresponding third sub-electrode line 155, such that the light-shielding layer BM completely covers the third sub-electrode lines 155. Therefore, the light that irradiates the surface of the third sub-electrode lines far away from the substrate 12 when the light on the side of the light-emitting surface of the display panel 100 irradiates the side of the substrate 12 may be eliminated, and the surface of the third sub-electrode lines far away from the substrate 12 may not reflect the light to the light-emitting surface of the display panel 100, to achieve a good display effect on the basis of the display panel 100 having high display PPI and high touch PPI.

As shown in FIG. 2, FIG. 4, FIG. 6, FIG. 12, and FIG. 13, optionally, along the direction Z perpendicular to the plane where the substrate 12 is located, the area of one first light-transmission hole 61 may be S1, and the photosensitive area of one photosensitive device 14 may be S2, where 2×S1<S2.

In the present embodiment, along the direction Z perpendicular to the plane where the substrate 12 is located, the opening area of one first light-transmission hole 61 may be configured to be S1, and the photosensitive area of one photosensitive device 14 corresponding to the first light-transmission hole 61 may be configured to be S2. At this time, the sum of the areas (2×S1) of the two first light-transmission holes 61 corresponding to the photosensitive device 14 may be configured to be smaller than the photosensitive area S2 of the photosensitive device 14, such that that the reflected light corresponding to the touch body transmitted through the first light-transmission holes 61 may fall more into the photosensitive surface of the photosensitive device 14 and improve the amount of the reflected light received by the photosensitive surface of the photosensitive device 14 through the first light-transmission holes 61 corresponding to the touch body. The touch effect of the corresponding display device may be improved.

The embodiment shown in FIG. 13 which is a partial perspective view of the display panel illustrating the arrangement relationship among the first light-transmission holes 61, the photosensitive devices 14, and the third sub-electrode lines 155, is used as an example only to illustrate the present disclosure, and does not limit the scope of the present disclosure. The orthographic projection areas of the first light-transmission holes 61 and of the photosensitive devices 14 are not limited to the setting as shown in FIG. 13. For example, in some other embodiments, the orthographic projection areas of the first light-transmission holes 61 may be located within the orthographic projection areas the corresponding photosensitive devices 14.

Figure 14:
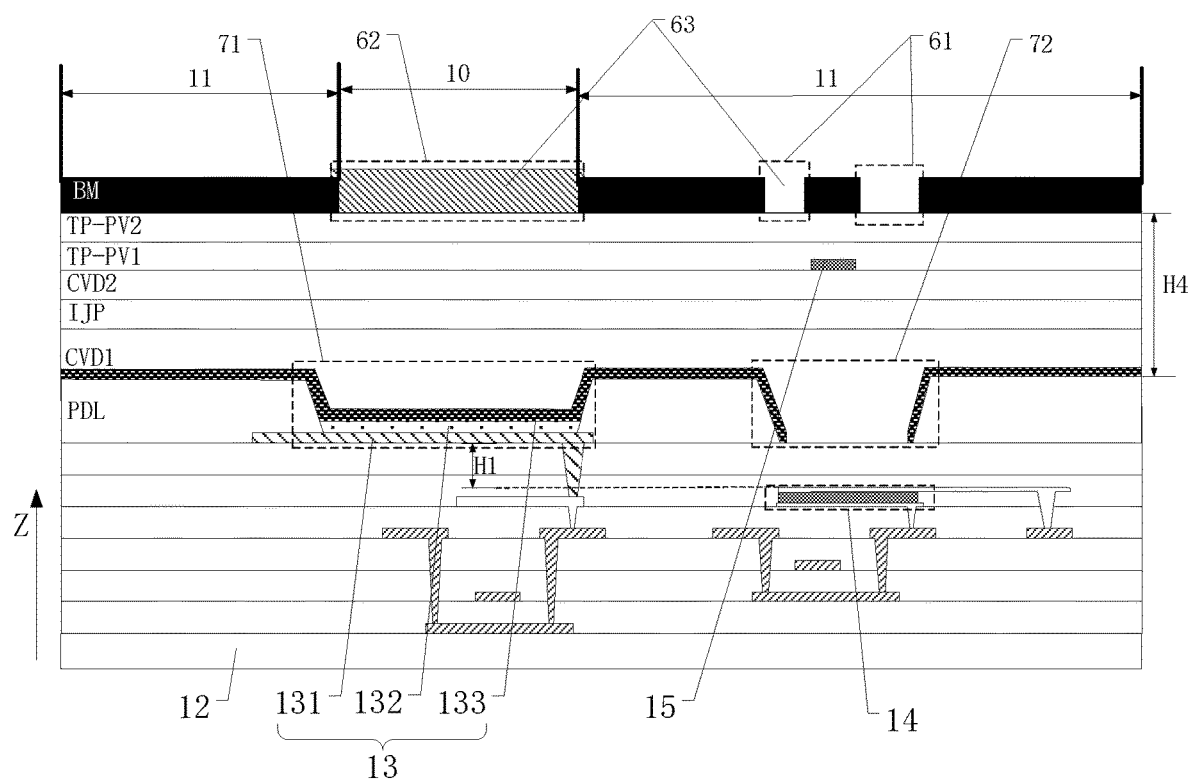
FIG. 14 illustrates another cross-sectional view of the display panel along an AA' direction in FIG. 2, consistent with various disclosed embodiments of the present disclosure.

FIG. 14 shows another cross-sectional view along the AA' direction in FIG. 2. As shown in FIG. 2, FIG. 4, and FIG. 14, in one embodiment, at least a portion of the first light-transmission holes 61 may be filled with first color blockers 63. The first color blockers 63 may have a color same as the first light-emitting devices 311.

In the present embodiment, as shown in FIG. 14, to ensure the light-transmission effect of one first light-transmission hole 61, the first light-transmission hole 61 may have a hollowed-out state. Further, the first light-transmission hole 61 may be filled with a colorless and transparent material, to avoid the deformation of the first light-transmission hole 61 and play a supporting effect on other film materials disposed on the side of the light-shielding layer BM away from the substrate 12. The occurrence of sinking of film layer materials in the area corresponding to the first light-transmission hole 61 may be avoided, improving the stability of the film layer of the display panel 100.

Further, red light may be able to pass through the finger (the touching body) to form background noise, and the photosensitive devices 14 may be required to filtering out red light and infrared light, that is, it may be necessary to prevent red light and infrared light from being transmitted to the photosensitive surfaces of the photosensitive devices 14. Therefore, in the present embodiment, as shown in FIG. 4, a green color blocker (one first color blocker 63) may be disposed in the first light-transmission hole 61. The green light may have a high intensity, to filter out red light and infrared light in outdoor sunlight. The influence of red light and infrared light on the photosensitive effect of the photosensitive devices may be prevented, to improve the touch sensing effect of the display device corresponding to the display panel 100.

As shown in FIG. 2, FIG. 4, and FIG. 14, in one embodiment, along the direction Z perpendicular to the plane where the substrate 12 is located, one light-emitting device 13 may include an anode 131, a light-exiting layer 132, and a cathode 133 stacked in layers. The anode 131 may be disposed on the side of the light-exiting layer 132 facing the substrate 12. Along the direction Z perpendicular to the plane where the substrate 12 is located, the distance between the side surface of the anode 131 facing the substrate 12 and the side surface of one corresponding photosensitive device 14 away from the substrate 12 may be H1, where H1>2 μm.

In the present embodiment, along the direction Z perpendicular to the plane where the substrate 12 is located, one light-emitting device 13 may include an anode 131, a light-exiting layer 132, and a cathode 133 stacked in layers. The anode 131 may be disposed on the side of the light-exiting layer 132 facing the substrate 12. Along the direction Z perpendicular to the plane where the substrate 12 is located, the distance H1 between the side surface of the anode 131 facing the substrate 12 and the side surface of one corresponding photosensitive device 14 away from the substrate 12 may be configured to be equal to or larger than 2 μm. Therefore, the photosensitive surface of the corresponding photosensitive device 14 may be prevented from receiving large-angle light, to avoid the influence of the large-angle light on the photosensitive effect of the corresponding photosensitive device 14. The large-angle light may be the light irradiated to the photosensitive surface of the photosensitive device 14 through the second light-transmission hole 62 corresponding to the adjacent light-emitting device 13 among the light irradiated from the light-emitting surface side to the side of the substrate 12.

Theoretically, the photosensitive device 14 may only need to be disposed on the side of the anode 131 facing the substrate 12. When the photosensitive surface of the photosensitive device 14 is too close to the anode 131, it may be easy to receive the large-angle light, that is, the large-angle light that irradiates the photosensitive surface through the adjacent second light-transmission hole 62, which may affect the photosensitive effect of the photosensitive device 14. Therefore, in principle, it may be better to configure the distance H1 between the side surface of the anode 131 facing the substrate 12 and the side surface of one corresponding photosensitive device 14 away from the substrate 12 to be equal to or larger than 2 μm.

As shown in FIG. 2, FIG. 4, and FIG. 14, in one embodiment, the display panel 100 may further include a pixel definition layer PDL.

Along the direction Z perpendicular to the plane where the substrate 12 is located, the pixel definition layer PDL may include first through holes 71 and second through holes 72 penetrating through its thickness. The light-emitting devices 13 may be at least partially located in the first through holes 71. The second through holes 72 may at least partially overlap the photosensitive devices 14 and at least partially overlap the first light-transmission holes 61. The pixel definition layer PDL may include a light-shielding material.

In the present embodiment, the display panel 100 may also include the pixel definition layer PDL. The pixel definition layer PDL may include a plurality of two types of through holes penetrating through the thickness. The two types of through holes may include the first through holes 71 and the second through holes 72. The first through holes 71 may be used for the production of the light-emitting devices 13, and the second through holes 72 may be used for accommodating the photosensitive devices 14 in the thickness direction of the display panel 100. The second through holes 72 may at least partially overlap the photosensitive devices 14 and at least partially overlap the first light-transmission holes 61, such that the light reflected by the touch body may be able to pass through the first light-transmission holes 61 and the second through-holes 72 to irradiate the surface of the photosensitive devices 14. The pixel definition layer PDL may be made of a light-shielding material. At this time, the second through holes 72 may at least partially overlap the photosensitive devices 14 and at least partially overlap the corresponding first light-transmission holes 61, such that the second through holes 72 and the first light-transmission holes 61 may cooperate to realize that the light reflected by the touch body passes through the second through holes 72 and the first light-transmission holes 61 to irradiate the photosensitive devices 14. Therefore, the angle of the incident light among the light irradiating the photosensitive surface of the photosensitive devices 14 may be limited at least through the two holes of the two film layers (the second through holes 72 and the first light-transmission holes 61). The resolution of fingerprint imaging and the fingerprint recognition effect of the display device corresponding to the display panel 100 may be improved.

The previous embodiment where the film layer corresponding to one photosensitive device 14 only include one second through hole 72 and one corresponding first light-transmission hole 61 to limit the incident angle of the light irradiating the photosensitive surface of the photosensitive device 14 is used as an example only to illustrate the present disclosure, and does not limit the scope of the present disclosure. In some other embodiments, according to requirements, 3, 4, 5, or more through holes (light-transmission holes) may be disposed in the film layer structure of the display panel 100 to limit the incident angle of the light irradiating the photosensitive surface of the photosensitive device 14. Also, the specific film layer position of the through holes (light-transmission holes) in the display panel 100 is not limited in the present disclosure, which may be adjusted according to the actual situation. In other words, the cover plate of the flexible display screen may be thinner than the cover plate of the straight screen, and the light-transmission region may be limited by setting two through holes to limit the area of the recognized fingerprint. Of course, there may be more than two through holes according to various embodiments of the present disclosure. In general, the more through holes there are, the greater the thickness of the light-shielding layer BM may be, and the opening diameter of the through holes may be reduced.

As shown in FIG. 14, the display panel 100 may also include a driving device TFT1 electrically connected to one light-emitting device 13, and a driving device TFT2 electrically connected to one corresponding photosensitive device 14. The driving device TFT1 and the driving device TFT2 both may include an active layer, a gate, and a source/drain. An insulating layer may be disposed between the active layer and the gate, and another insulating layer may be disposed between gate and the source/drain, to ensure the drive device TFT1 and drive device TFT2 to work properly and avoid signal crosstalk issues. The driving device TFT1 electrically connected to the light-emitting device 13 may be a P-type transistor, but the present disclosure is not limited to this. In addition, the side of the pixel definition layer PDL facing the light-shielding layer BM may be usually further provided with a first inorganic layer CVD1, an inkjet layer IJP, a second inorganic layer CVD2, a first touch insulating layer TP-PV1, and a second touch insulating layer TP-PV2. The film layer structure here is only an optional film layer structure diagram of the display panel 100 provided by the present disclosure, and does not limit the scope of the present disclosure.

As shown in FIG. 2, FIG. 4, FIG. 11, and FIG. 13, in the direction Z perpendicular to the plane where the substrate 12 is located, the distance between the side surface of the pixel definition layer PDL facing the light shielding layer BM and the side surface of the light shielding layer BM facing the pixel definition layer PDL may be H4. Along the fourth direction Y4, the size of the photosensitive devices 14 may be D, and the opening size of the first light-transmission holes 61 may be W2, where $2(H1+H4) \times \tan\theta = D+W2$ and $\theta$ is the collimation angle between the first light-transmission holes 61 and the photosensitive devices 14.

, the present embodiment provides an optional relationship of the size of the photosensitive devices 14 and the size of the first light-transmission holes 61 along the fourth direction Y4, and a pixel definition layer PDL and the distance between the pixel definition layer PDL and the light shielding layer BM along the direction Z perpendicular to the plane where the substrate 12 is located. Therefore, at least one of the values of H1, H4, D, and W2 may be adjusted and defined according to the requirements in the design, such that the photosensitive devices 14 may be able to have a large enough light-receiving amount and the display panel 100 has a thinner design at the same time. The touch effect of the corresponding display device may be improved and the user's thinner requirement for the display device may be met at the same time.

, $\theta$ may be half of the smallest angle between the first connecting lines between the first side of the first light-transmission holes and the second side of the photosensitive devices in the cross-sectional view of the display panel and the second connection lines between the second side of the first light-transmission holes and the first side of the photosensitive devices.

Figure 15:
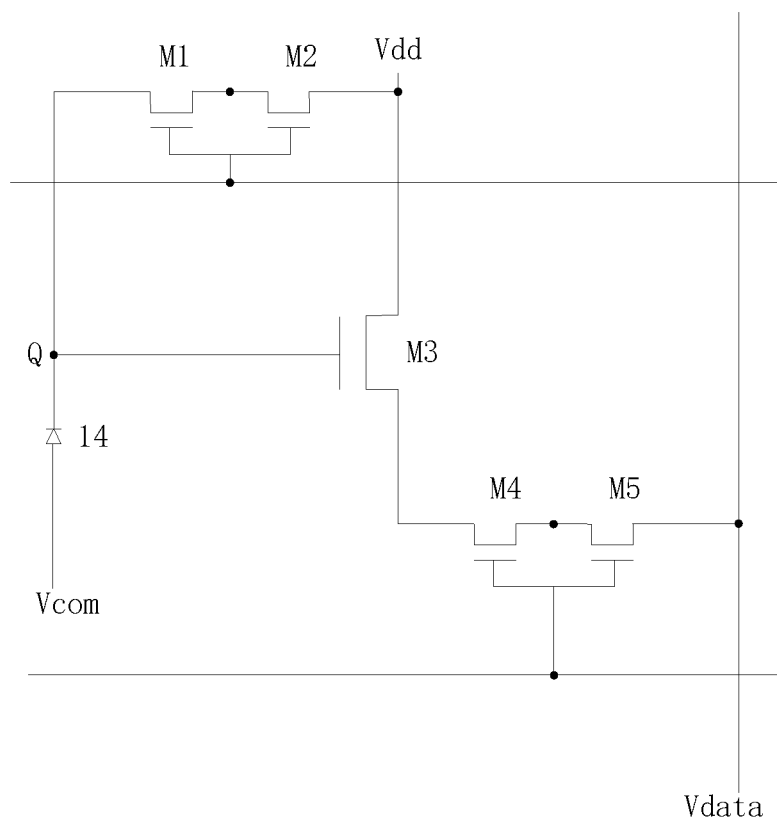
FIG. 15 illustrates a schematic diagram of an exemplary photosensitive control circuit consistent with various disclosed embodiments of the present disclosure.

The display panel 100 may further include photosensitive control circuits 80. As shown in FIG. 2, FIG. 4, and FIG. 15, one photosensitive device 14 may be electrically connected to one corresponding photosensitive control circuit 80. The photosensitive control circuit 80 may include at least three transistors. The transistors may be N-type transistors, and active layers of the transistors may include metal oxide.

, in one embodiment, the display panel 100 may further include the photosensitive control circuits 80, which may be electrically connected to the photosensitive devices 14 for controlling the photosensitive devices 14 and detecting the touch recognition light received by the photosensitive devices 14, to realize the fingerprint recognition function of the photosensitive devices 14. In one embodiment, one photosensitive control circuit 80 may include at least 3 transistors, and these three transistors may be N-type transistors. The active layers of the transistors may include metal oxide. As shown in FIG. 15, the detection of the photosensitive control circuit 80 may actually need to obtain the value of the following voltage of the photosensitive signal at the Q point, and a source of an N-type transistor is disposed between M3 and M4. When it is a P-type transistor, the source of M3 may be the Vdd node above M3, and what the corresponding pixel read may not be the voltage at point Q. Therefore, the transistors in the photosensitive control circuit 80 may be N-type transistors, to ensure the photosensitive function of the photosensitive device 14. For example, the transistors in the photosensitive control circuit 80 may all use indium gallium zinc oxide (IGZO) transistors.

The double-gate transistors M1 and M2 in the output in the photosensitive control circuit 80 may also be replaced with single-gate transistors in some other embodiments. That is, one of the double-gate transistors of M1 and M2 may be replaced with a single-gate transistor. The double-gate transistors of M4 and M5 may also be replaced with single-gate transistors.

Figure 16:
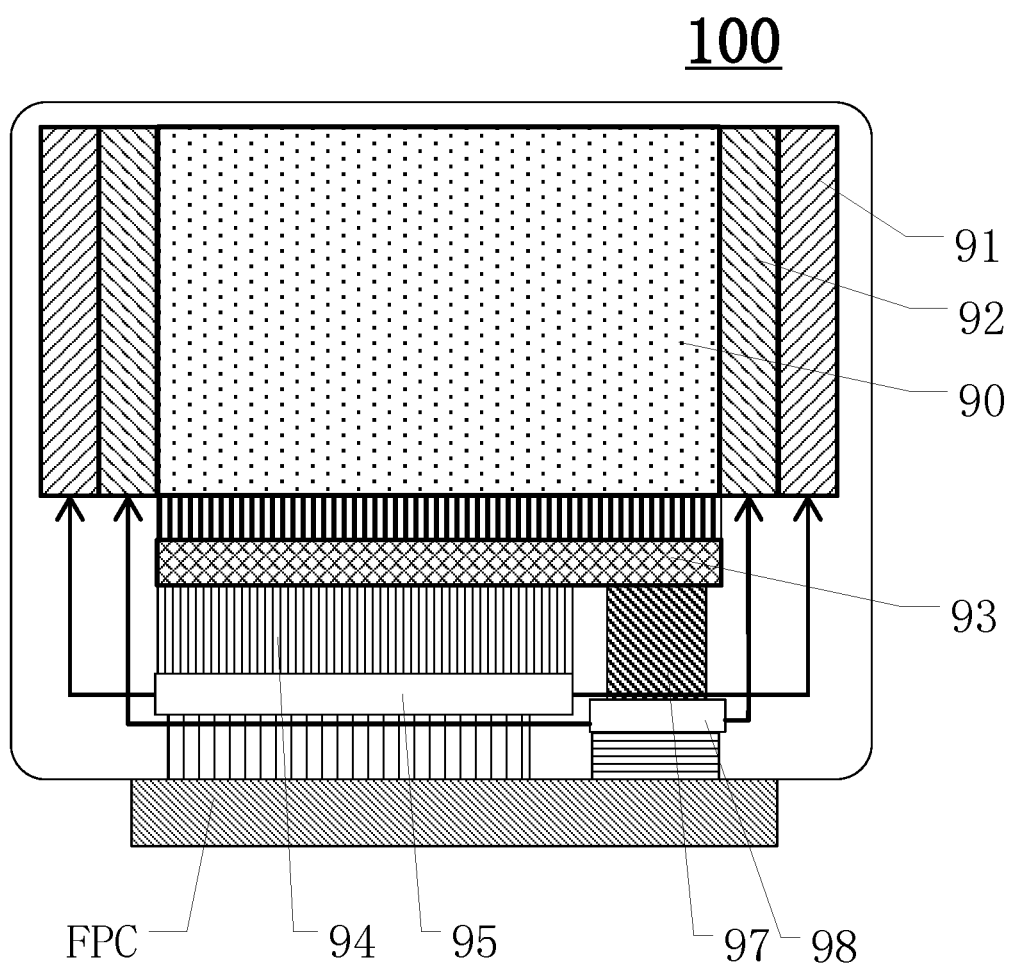
FIG. 16 illustrates an exemplary architectural schematic of an exemplary display panel, consistent with various disclosed embodiments of the present disclosure.

FIG. 16 is a structural diagram of a display panel provided by one embodiment of the present disclosure. In the display panel 100, the optical fingerprint sensor circuits (such as the photosensitive control circuits 80) and the display-related circuits may have independent driver chips, independent scanning circuits and independent multiplexer circuits. As shown in FIG. 16, the display panel 100 may include a display scanning circuit 91 disposed independently and electrically connected to display driving circuits 95, and a fingerprint scanning circuit 92 disposed independently and electrically connected to the fingerprint driver chips 98. The display panel 100 may also include a fingerprint multiplexer circuit 93 disposed independently and electrically connected to the fingerprint driver chips 98 through the fingerprint fan-out region 97. The display driver chips 95 in the display panel 100 in FIG. 16 may pass through the display fan-out region 94 and may be directly connected to the data signal lines of the display panel 100. Therefore, the display panel 100 in FIG. 16 may not include a display multiplexer circuit. Of course, in some other embodiments, after passing through the display fan-out region 94, the display driver chips 95 in the display panel 100 may be electrically connected to a display multiplexer circuit and then connected to the data signal lines of the display panel 100. Other unmarked regions may be used as routing regions, and the required routing may be set according to requirements.

Figure 17:
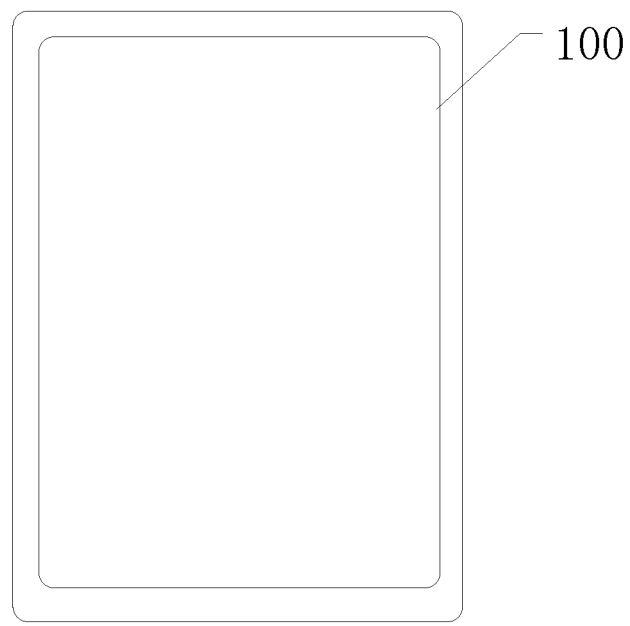
FIG. 17 illustrates an exemplary display device consistent with various disclosed embodiments of the present disclosure.

The present disclosure also provides a display device. As shown in FIG. 17, in one embodiment, the display device 200 may include any display panel 100 provided by various embodiments of the present disclosure.

In the present disclosure, the display device 200 may be any component or product with touch function, such as a cell phone, a tablet, a television, a touch controller, a laptop computer, or a navigator. The display device provided by the present disclosure may have advantages same as the display panels provided by the present disclosure.

In the display panel and display device provided by various embodiments of the present disclosure, the light-emitting devices and the photosensitive devices in the display panel may be arranged on the same side of the substrate. The light-emitting devices may be arranged in the light-emitting region of the display panel, and the photosensitive devices may be arranged in the non-light-emitting region of the display panel, such that the light-emitting devices and the photosensitive devices are disposed in a same film layer structure as much as possible, to avoid the excessive increase of the film thickness of the display panel caused by the simultaneous installation of the light-emitting devices and the photosensitive devices in the display panel. Also, the deterioration of the overall bending performance of the display panel induced by the separate film layer setting of the photosensitive devices may be weakened, to improve the bending performance of the corresponding display device including the display function and the fingerprint recognition function.

Various embodiments have been described to illustrate the operation principles and exemplary implementations. It should be understood by those skilled in the art that the present disclosure is not limited to the specific embodiments described herein and that various other obvious changes, rearrangements, and substitutions will occur to those skilled in the art without departing from the scope of the disclosure. Thus, while the present disclosure has been described in detail with reference to the above described embodiments, the present disclosure is not limited to the above described embodiments, but may be embodied in other equivalent forms without departing from the scope of the present disclosure, which is determined by the appended claims.

What is claimed is:

1. A display panel, comprising:
a substrate;
light-emitting devices on a side of the substrate;
photosensitive devices on the side of the substrate same as the light-emitting devices; and
touch electrodes on a side of the photosensitive devices away from the substrate,
wherein:
the display panel includes a light-emitting region and a non-light-emitting region;
the light-emitting devices correspond to the light-emitting region; and
the photosensitive devices are disposed in the non-light-emitting region, and wherein:
the touch electrodes include electrode lines located in the non-light-emitting region;
the electrode lines include first electrode lines extending along a first direction and second electrode lines extending along a second direction, wherein the first direction intersects with the second direction;
intersections of the first electrode line and the second electrode line define first sub-display regions; and
at least one of the first sub-display regions includes one of the photosensitive devices, or
wherein:
the touch electrodes include electrode lines located in the non-light-emitting region;
the display panel includes display units;
the display units are arranged along a third direction;
the electrode lines include third electrode lines extending along the third direction; and
along a direction perpendicular to a plane where the display panel is located, the third electrode lines overlap the photosensitive devices.

2. The display panel according to claim 1,
wherein:
one display unit includes at least two of the light-emitting devices;
the display panel includes a first display region; and
the first display region includes m of the display units and n of the photosensitive devices, wherein m>n and both m and n are positive integers, and wherein:
the touch electrodes include electrode lines located in the non-light-emitting region;
the electrode lines include first electrode lines extending along a first direction and second electrode lines extending along a second direction, wherein the first direction intersects with the second direction;
intersections of the first electrode line and the second electrode line define first sub-display regions; and
at least one of the first sub-display regions includes one of the photosensitive devices.

3. The display panel according to claim 1,
wherein:
one display unit includes at least two of the light-emitting devices;

the display panel includes a first display region; and the first display region includes m of the display units and n of the photosensitive devices, wherein men and both m and n are positive integers, and wherein:

the touch electrodes include electrode lines located in the non-light-emitting region;

the display units are arranged along a third direction;

the electrode lines include third electrode lines extending along the third direction; and along a direction perpendicular to a plane where the display panel is located, the third electrode lines overlap the photosensitive devices.

4. The display panel according to claim 3, wherein:

the light-emitting devices includes first light-emitting devices and second light-emitting devices that emit a same color;

the photosensitive devices include first photosensitive devices;

along a fourth direction, one first photosensitive device is disposed between one corresponding first light-emitting device and one corresponding second light-emitting device, the first photosensitive device and the first light-emitting device at least partially overlap, and the first photosensitive device and the second light-emitting device at least partially overlap, wherein the fourth direction is a direction from the first light-emitting device to the second light-emitting device; and the fourth direction intersects the third direction.

5. The display panel according to claim 4, wherein:

the third electrode lines include third sub-electrode lines, and the third sub-electrode lines overlap the first photosensitive devices;

along the fourth direction, a distance between one third sub-electrode line and one corresponding first light-emitting devices is X', with $X_{min} \leq X' \leq X_{max}$;

$$X_{min} = \frac{P+D}{4} \times \frac{h_2}{h_3},$$
$$X_{max} = \frac{P-W}{2}, h_3 = \frac{La \times h_2}{2X'},$$

wherein P is a distance between the first light-emitting device and one corresponding second light-emitting device along the fourth direction, D is the size of the photosensitive device along the fourth direction, W is the width of the third sub-electrode line along the fourth direction, $h_2$ is a distance between the side surface of the light-emitting device away from the substrate and the side surface of the third sub-electrode line facing the substrate along the direction perpendicular to the substrate, and La is the distance between the side of the first light-emitting device facing the first photosensitive device and the side of the first photosensitive device away from the first light-emitting device along the fourth direction.

6. The display panel according to claim 4, wherein:

the third electrode lines include third sub-electrode lines, and the third sub-electrode lines overlap the first photosensitive devices; and one third sub-electrode line is located on a midperpendicular line between one corresponding first light-emitting device and one corresponding second light-emitting device.

7. The display panel according to claim 4, wherein:

the light-emitting color of the first light-emitting devices and the second light-emitting devices is green.

8. The display panel according to claim 4, wherein:

the light-emitting devices further include third light-emitting devices and fourth light-emitting devices, and the light-emitting colors of the third light-emitting devices, the fourth light-emitting devices, and the first light-emitting devices are different; and along the fourth direction, an opening size of the first light-emitting devices is Lg, an opening size of the third light-emitting devices is Lr, and an opening size of the fourth light-emitting devices is Lb, wherein Lg=(Lr+Lb)/2.

9. The display panel according to claim 4, wherein:

the third electrode lines include third sub-electrode lines, and the third sub-electrode lines overlap the first photosensitive devices;

the display panel further includes a light-shielding layer;

along the direction perpendicular to the plane where the substrate is located, the light-shielding layer is located on a side of the touch electrodes away from the substrate; and along the direction perpendicular to the plane where the substrate is located, the light-shielding layer and the third sub-electrode lines are at least partially overlapped.

10. The display panel according to claim 9, wherein:

along the direction perpendicular to the plane where the substrate is located, the light shielding layer includes first light-transmission holes and second light-transmission holes penetrating through its thickness, wherein one first light-transmission hole at least partially overlaps one corresponding photosensitive device and one second light-transmission hole at least partially overlaps one corresponding light-emitting device;

along the fourth direction, one first light-transmission hole is located between one corresponding first light-emitting device and one corresponding third sub-electrode line; and along the fourth direction, a distance between one first light-transmission hole and one adjacent second light-transmission holes is W1, and the opening size of the first light-transmission holes is W2, wherein W2>W1.

11. The display panel according to claim 10, wherein:

along the fourth direction, there are at least two first light-transmission holes between one first light-emitting device and one corresponding second light-emitting device, and the distance between the two first light-transmission holes is W3, wherein W3>W and W is the width of the third sub-electrode line along the fourth direction.

12. The display panel according to claim 11, wherein:

along the direction perpendicular to the plane where the substrate is located, the area of the first light-transmission holes is S1, and the photosensitive area of the photosensitive devices is S2, wherein 2×S1<S2.

13. The display panel according to claim 10, wherein:

at least a portion of the first light-transmission holes is filled with first color blockers, and the first color blockers have a color same as the first light-emitting devices.

14. The display panel according to claim 10, wherein:

along the direction perpendicular to the plane where the substrate is located, one light-emitting device includes an anode, a light-extracting layer, and a cathode stacked in layers, wherein the anode is located on a side of the light-exiting layer facing the substrate; and along the direction perpendicular to the plane where the substrate is located, a distance between a surface of the anode facing the substrate and a surface of the photosensitive devices away from the substrate is H1, wherein H1≥2 μm.

15. The display panel according to claim 14, further comprising a pixel definition layer, wherein:
along the direction perpendicular to the plane where the substrate is located, the pixel definition layer includes first through holes and second through holes penetrating through an entire thickness;
the light-emitting devices are at least partially located in the first through holes;
the second through holes at least partially overlap the photosensitive devices, and at least partially overlap the first light-transmission holes; and
the pixel definition layer is made of a material including a light-shielding material.

16. The display panel according to claim 15, wherein:
along the direction perpendicular to the plane where the substrate is located, a distance between a side surface of the pixel definition layer facing the light-shielding layer and a side surface of the light-shielding layer facing the pixel definition layer is H4;
along the fourth direction, the size of the photosensitive devices is D and the opening size of the first light-transmission holes is W2; and
2 (H1+H4)×tan θ=D+W2; wherein θ is a collimation angle of the first light-transmission holes the photosensitive devices.

17. The display panel according to claim 14, further comprising a photosensitive control circuit, wherein:
the photosensitive devices are electrically connected to the photosensitive control circuit; and
the photosensitive control circuit includes at least three transistors; and
the at least three transistors are N-type transistors and include active layers made of a material including metal oxides.

18. A display device, comprising a display panel, wherein:
the display panel includes:
a substrate;
light-emitting devices on a side of the substrate;
photosensitive devices on the side of the substrate same as the light-emitting devices;
and touch electrodes on a side of the photosensitive devices away from the substrate,
wherein:
the display panel includes a light-emitting region and a non-light-emitting region;
the light-emitting devices correspond to the light-emitting region; and
the photosensitive devices are disposed in the non-light-emitting region, and wherein:
the touch electrodes include electrode lines located in the non-light-emitting region;
the electrode lines include first electrode lines extending along a first direction and second electrode lines extending along a second direction, wherein the first direction intersects with the second direction;
intersections of the first electrode line and the second electrode line define first sub-display regions; and
at least one of the first sub-display regions includes one of the photosensitive devices.

19. A display device, comprising a display panel, wherein:
the display panel includes:
a substrate;
light-emitting devices on a side of the substrate;
photosensitive devices on the side of the substrate same as the light-emitting devices;
and touch electrodes on a side of the photosensitive devices away from the substrate,
wherein:
the display panel includes a light-emitting region and a non-light-emitting region;
the light-emitting devices correspond to the light-emitting region; and
the photosensitive devices are disposed in the non-light-emitting region, and
wherein:
the touch electrodes include electrode lines located in the non-light-emitting region;
the display panel includes display units;
the display units are arranged along a third direction;
the electrode lines include third electrode lines extending along the third direction; and
along a direction perpendicular to a plane where the display panel is located, the third electrode lines overlap the photosensitive devices.

* * * * *